US007834395B2

(12) United States Patent
Temmler et al.

(10) Patent No.: US 7,834,395 B2
(45) Date of Patent: Nov. 16, 2010

(54) 3-D CHANNEL FIELD-EFFECT TRANSISTOR, MEMORY CELL AND INTEGRATED CIRCUIT

(75) Inventors: Dietmar Temmler, Dresden (DE); Alexander Sieck, Dresden (DE)

(73) Assignee: Qimonda AG, Munich (DE)

( * ) Notice: Subject to any disclaimer, the term of this patent is extended or adjusted under 35 U.S.C. 154(b) by 304 days.

(21) Appl. No.: 11/674,164

(22) Filed: Feb. 13, 2007

(65) Prior Publication Data

US 2008/0191257 A1    Aug. 14, 2008

(51) Int. Cl.
H01L 27/088    (2006.01)
(52) U.S. Cl. ............... 257/333; 257/330; 257/E29.13; 257/E29.201
(58) Field of Classification Search ........... 257/330, 257/333, E29.201, E29.13
See application file for complete search history.

(56) References Cited

U.S. PATENT DOCUMENTS

| | | | | |
|---|---|---|---|---|
| 5,723,891 | A * | 3/1998 | Malhi ................ | 257/341 |
| 5,945,707 | A | 8/1999 | Bronner et al. | |
| 6,656,807 | B2 * | 12/2003 | Bronner et al. ........ | 438/296 |
| 7,274,060 | B2 * | 9/2007 | Popp et al. ........... | 257/302 |
| 7,371,645 | B2 * | 5/2008 | Muemmler et al. ..... | 438/270 |
| 2003/0001194 | A1 * | 1/2003 | DeBoer et al. ........ | 257/310 |
| 2005/0090068 | A1 * | 4/2005 | Park ................. | 438/305 |
| 2005/0285153 | A1 * | 12/2005 | Weis et al. .......... | 257/232 |
| 2006/0076602 | A1 | 4/2006 | Harter et al. | |
| 2007/0132016 | A1 * | 6/2007 | Elwin ............... | 257/330 |

FOREIGN PATENT DOCUMENTS

| | | |
|---|---|---|
| DE | 19825524 A1 | 2/1999 |
| DE | 10361695 | 2/2005 |
| DE | 102004031385 | 1/2006 |

OTHER PUBLICATIONS

J.Y. Kim, et al. "The breakthrough in data retention time of DRAM using recess-channel-array transistor (RCAT) for 88 nm feature size and beyond," in Symp, Very Large Scale Integration Tech., 2003.
T. Park et al, "Fabrication of Body-tied FinFETs(Omega MOSFETs) Using Bulk Si Wafers" in Symp. Very Large Scale Integration Tech., 2003.
B. Goebel et al., "Fully Depleted Surrounding Gate Transistor (SGT) for 70 nm DRAM and Beyond" in IEEE, 2002.

* cited by examiner

*Primary Examiner*—Davienne Monbleau
*Assistant Examiner*—Eduardo A Rodela
(74) *Attorney, Agent, or Firm*—Edell, Shapiro & Finnan, LLC

(57) ABSTRACT

A field-effect transistor includes a source region, a drain region and a channel region between the source and the drain region. A gate electrode is also arranged between them, where a lower edge of the gate electrode is formed below a lower edge of at least one of the source and drain regions. A first insulator structure is provided between the gate electrode and the source region. A second insulator structure is provided between the gate electrode and the drain region. The first and the second insulator structures are formed asymmetric and may be adapted to different requirements. The asymmetric approach may provide longer transistor channels, a lower resistance of the gate electrode and smaller footprints for 3D-channel-transistors of, for example, array and support transistors in memory cells or power applications.

37 Claims, 30 Drawing Sheets

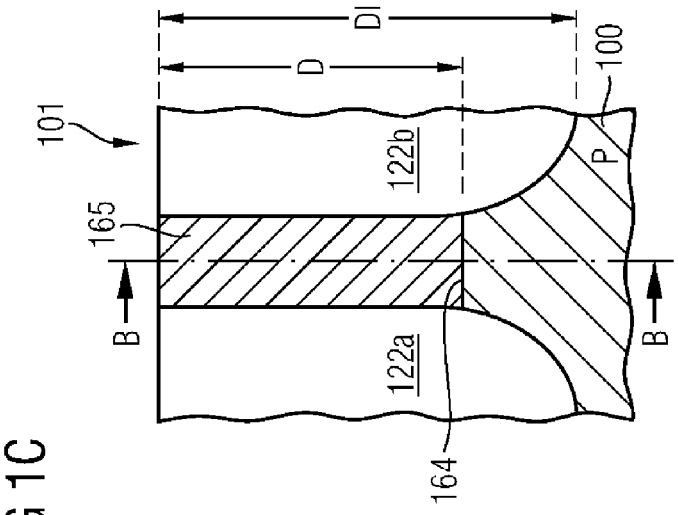
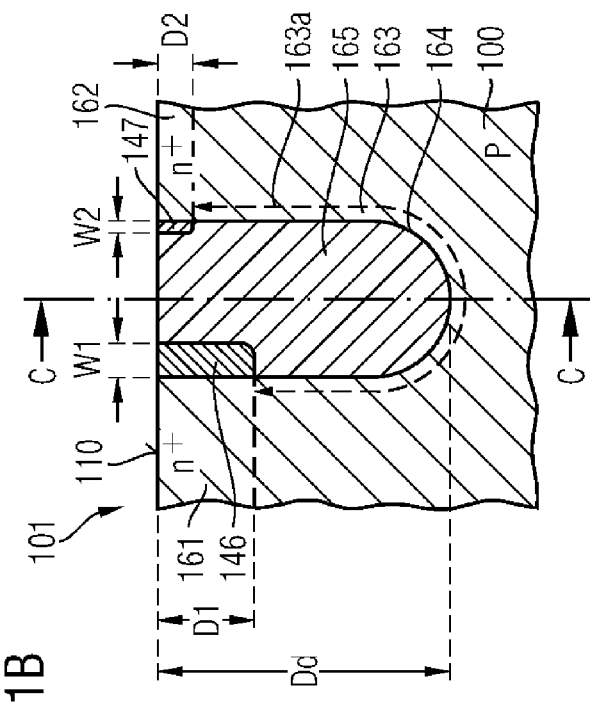
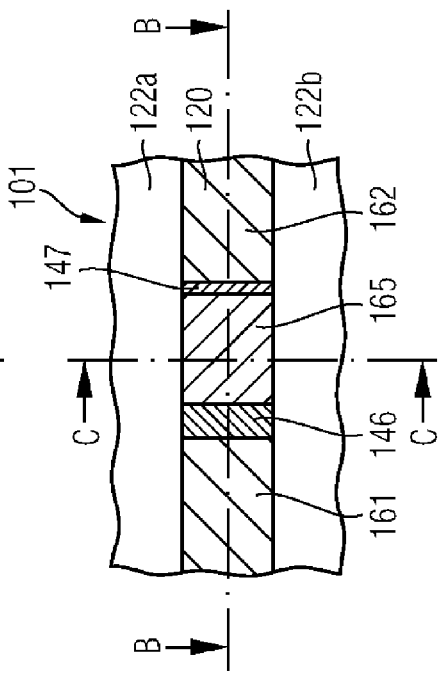
FIG 1C
FIG 1B
FIG 1A

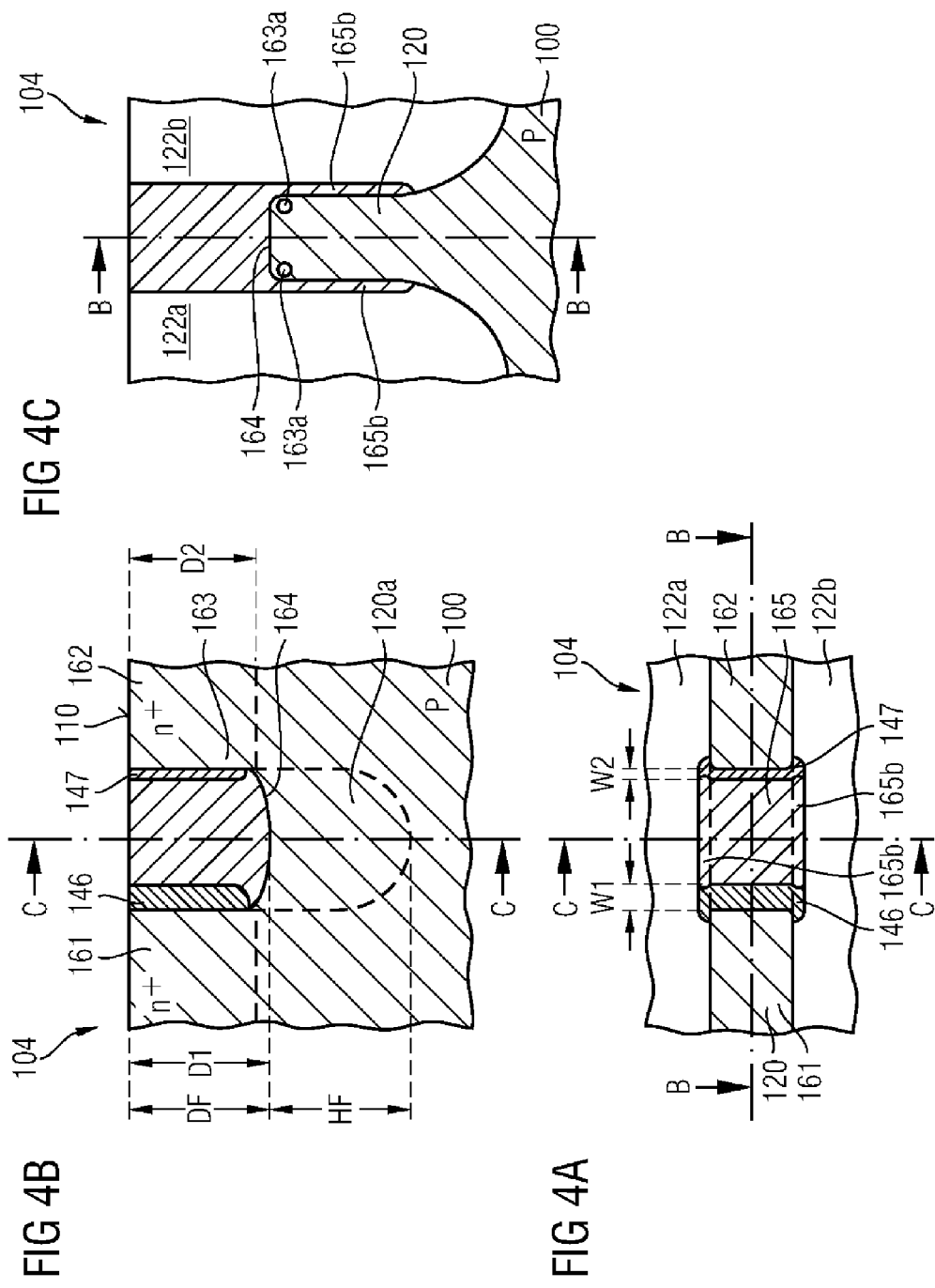

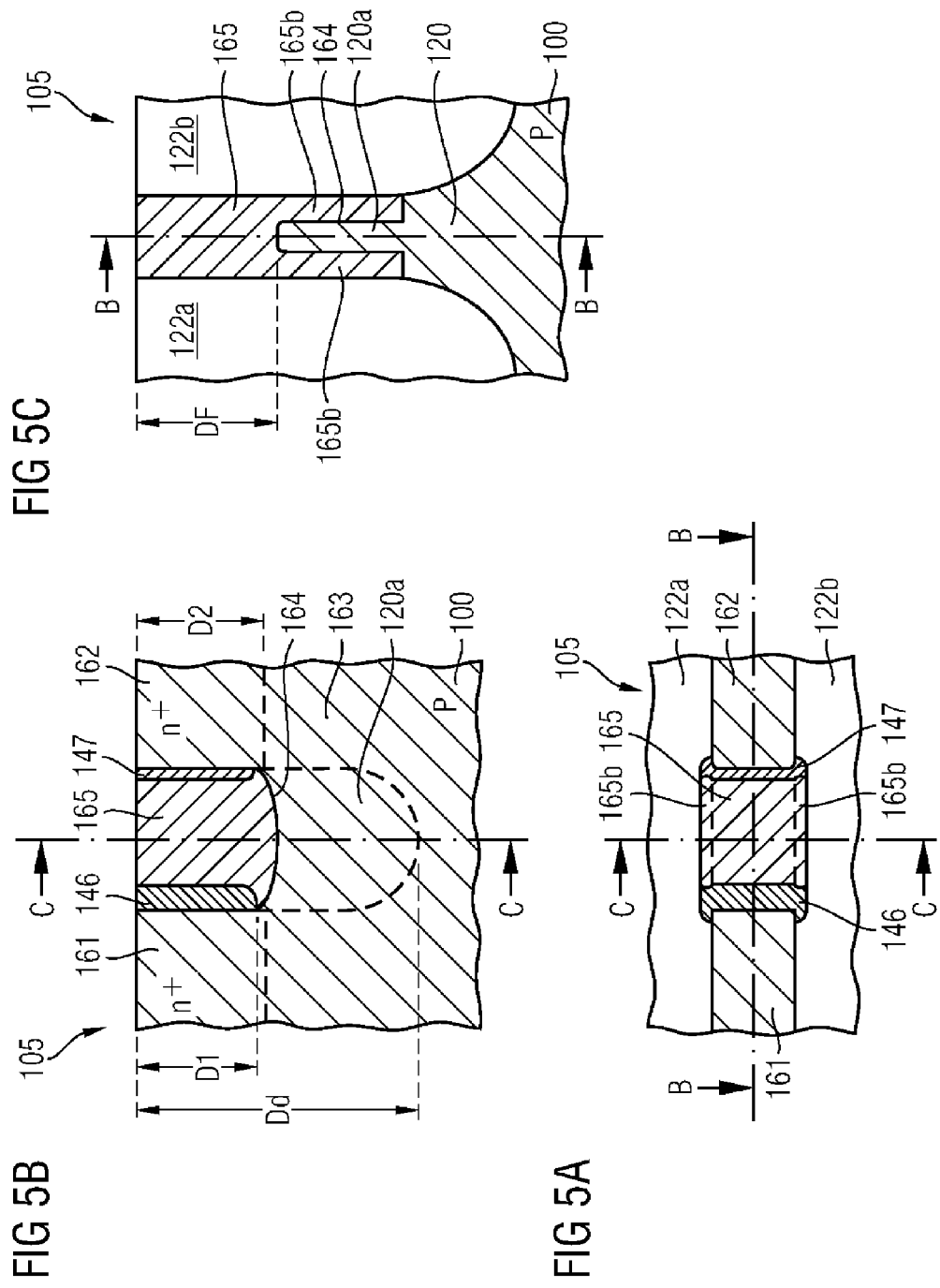

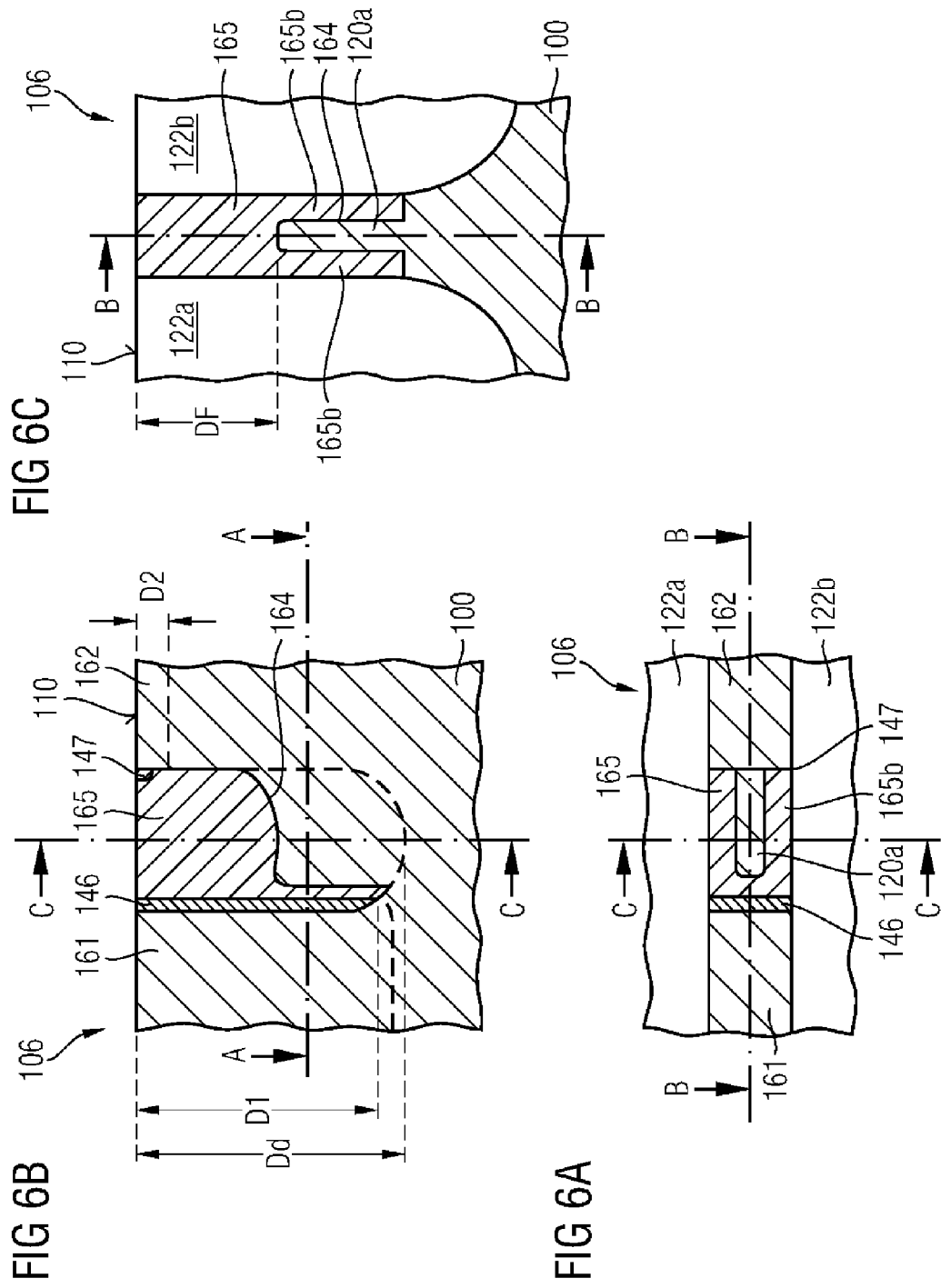

FIG 9M
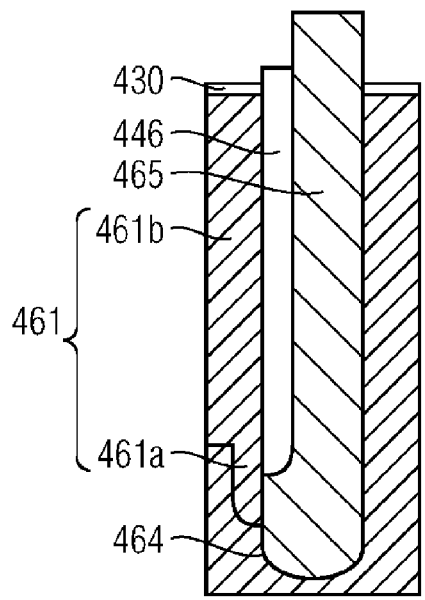
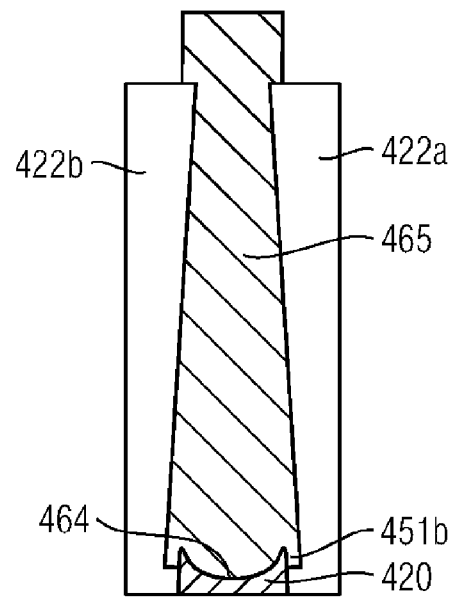
FIG 9N
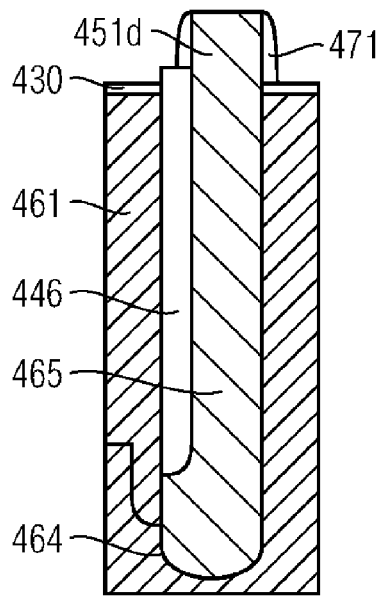
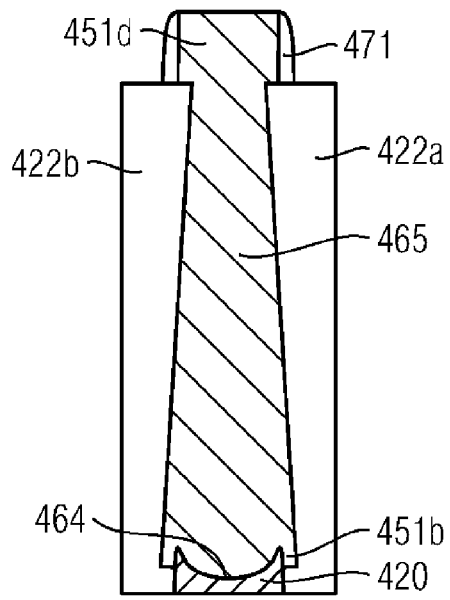

FIG 10G
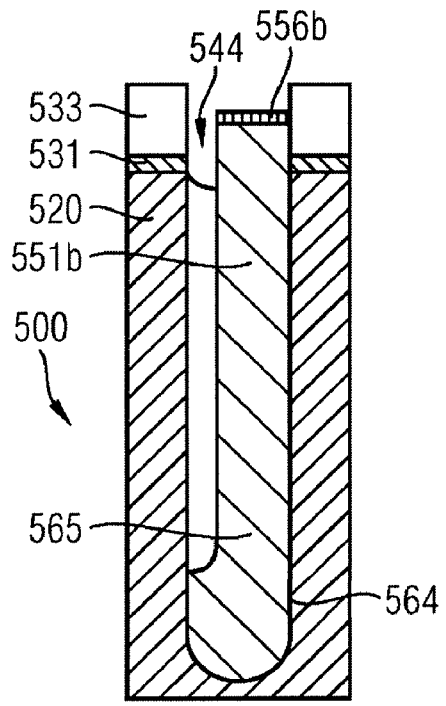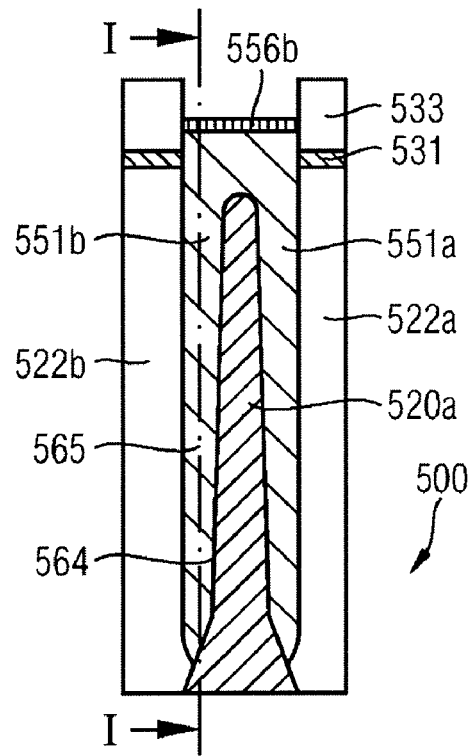
FIG 10H
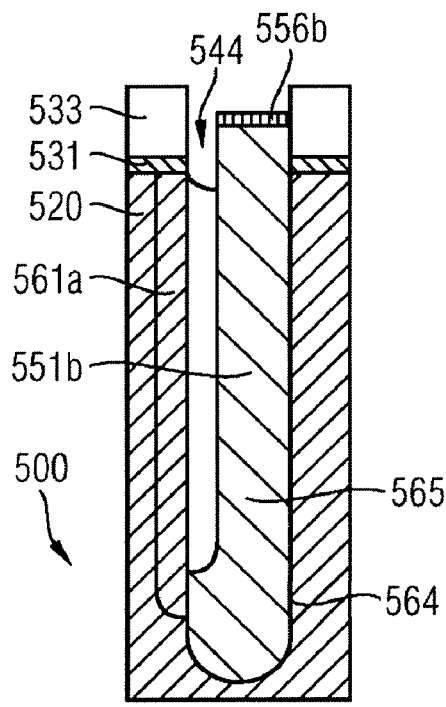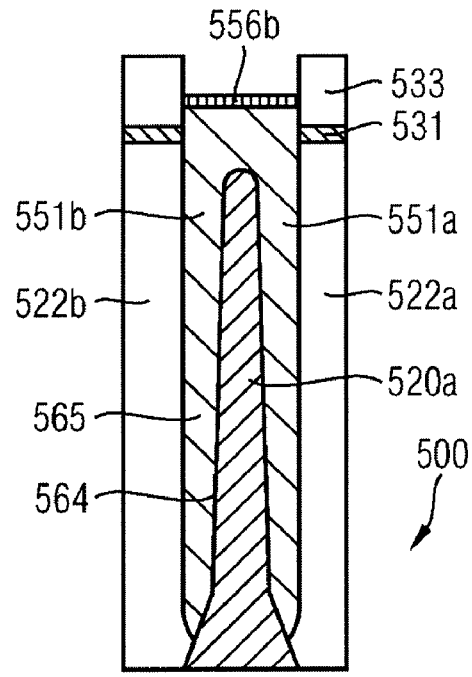

FIG 10I
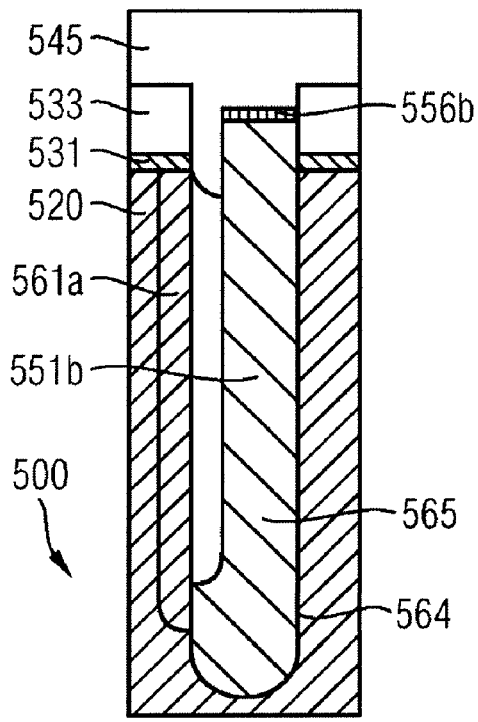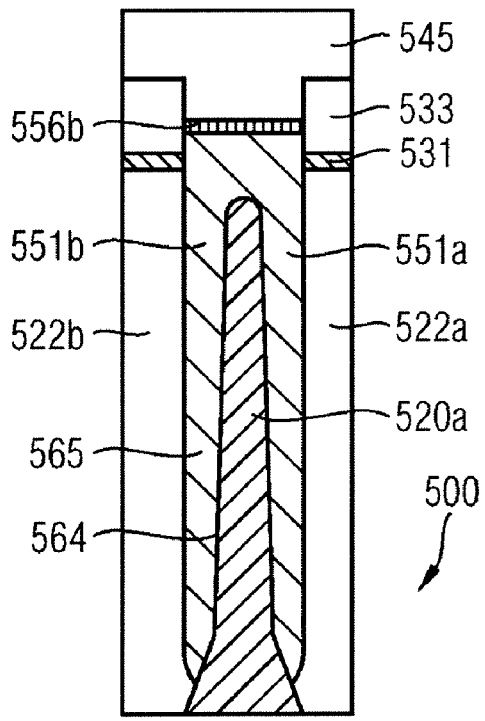
FIG 10J
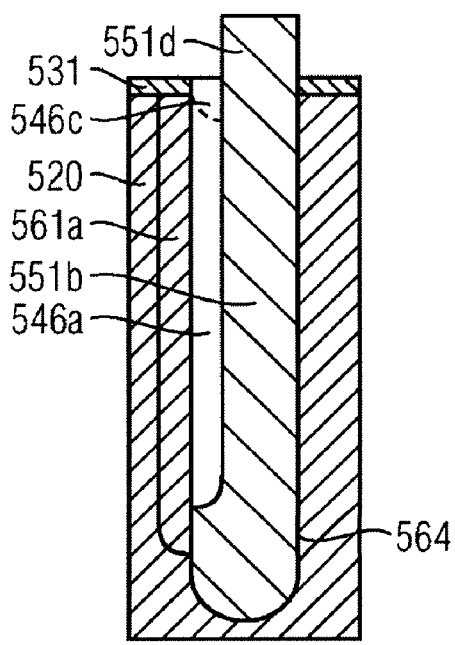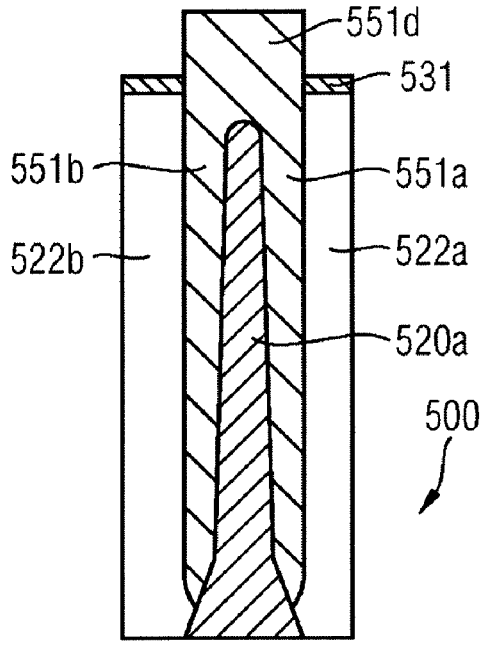

FIG 10M
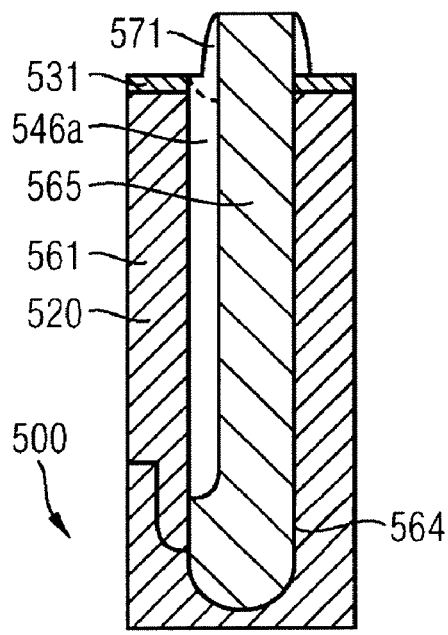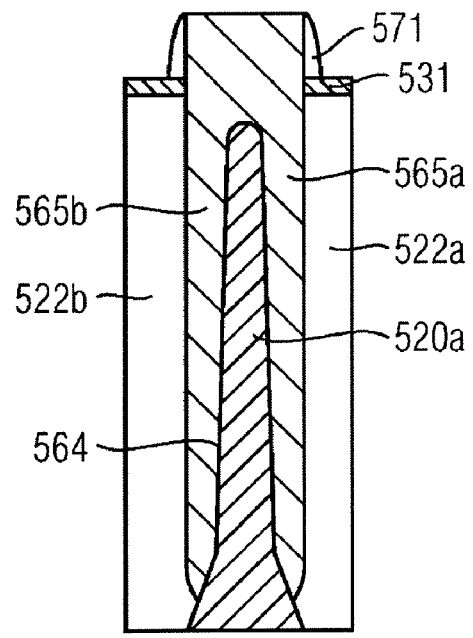
FIG 10N
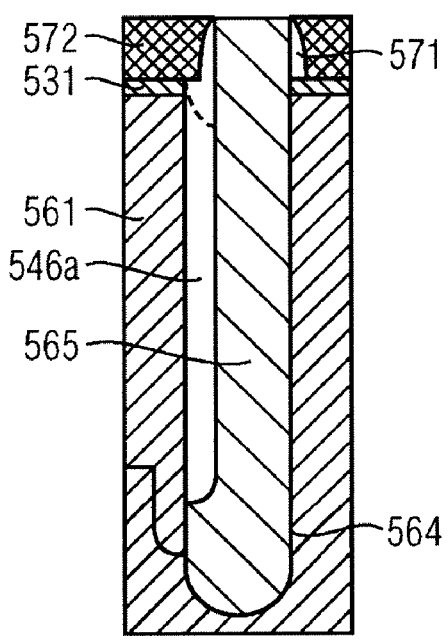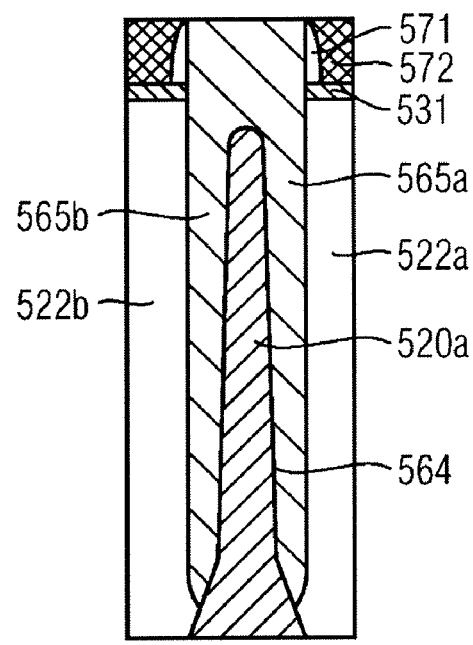

FIG 100
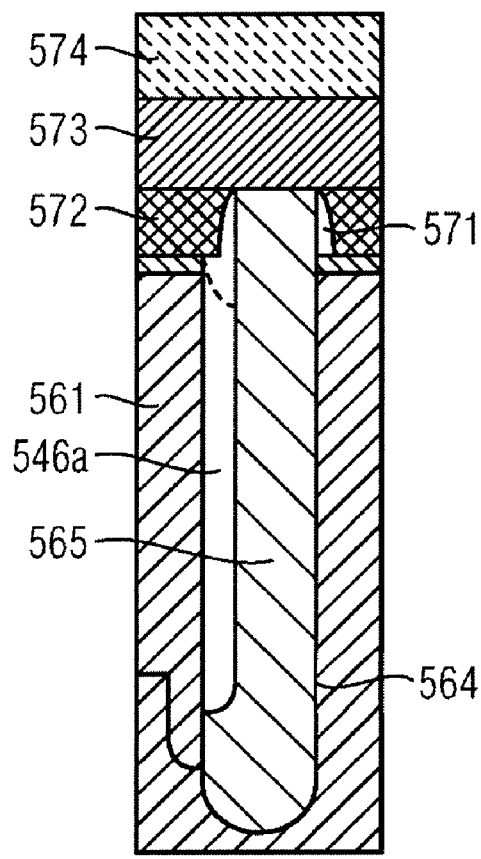
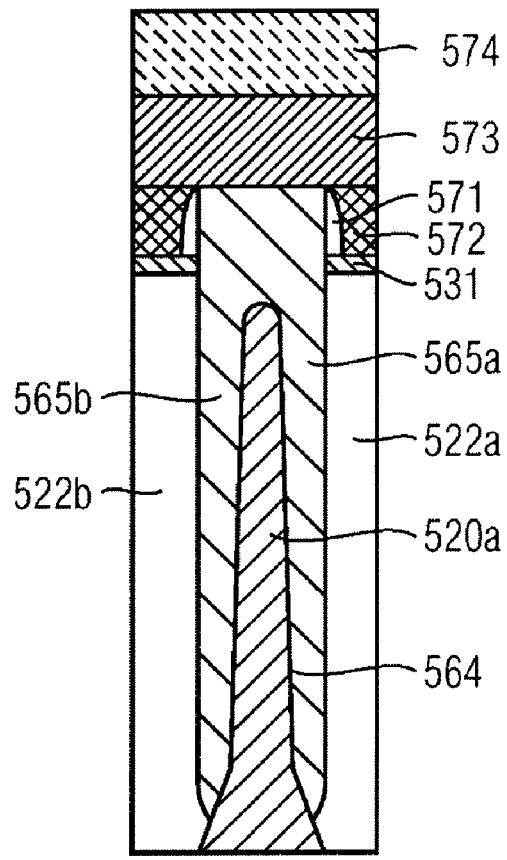

3-D CHANNEL FIELD-EFFECT TRANSISTOR, MEMORY CELL AND INTEGRATED CIRCUIT

BACKGROUND

A dynamic 1-transistor memory cell may comprise a storage element to store data and an access device to access the data stored in the storage element. The storage element may be a storage capacitor, a magnetoresistive element, a ferroelectric element of a phase-change element. Data may be stored by charging or discharging the storage capacitor.

The access device is typically a field-effect transistor (FET). An active area of the access transistor is formed in a single crystalline semiconductor substrate such as a silicon wafer. The active area comprises a first impurity region defining a source region, a second impurity region defining a drain region and a channel region being in contact with both the first and the second source/drain-region. The first and the second impurity regions have a first conductivity type. The channel region may have a second conductivity type that is the opposite of the first conductivity type.

The first impurity region may be connected to a storage node electrode of a storage capacitor. The second impurity region is connected to a bit line, which transmits data to and from the memory cell. The access transistor is controlled by a voltage applied to its gate electrode, which, for planar transistor devices, is arranged above a pattern surface of the substrate and which is adjacent to the respective channel section. A gate dielectric insulates the gate electrode from the channel region. The electric potential of the gate electrode controls the charge carrier distribution in the adjoining channel section by capacitive coupling. The gate electrodes of the access transistors of a plurality of memory cells are connected and form a connection line (word line) for addressing a row of memory cells within a memory cell array.

Applying a voltage higher than the threshold voltage to the gate electrode induces an inversion zone of mobile charge carriers in the channel section, where the charge carriers form a conductive channel in the channel section between the two impurity regions. The conductive channel connects the storage node electrode of the capacitor to the bit line. Applying a voltage lower than the threshold voltage to the gate electrode separates the storage node electrode from the bit line. At channel lengths below 400 nanometers, short channel effects occur.

A recessed channel array transistor (RCAT) or 3D-channel field-effect transistor with enhanced effective channel length provides a gate electrode arranged in a gate groove that is etched into the semiconductor substrate between the source and the drain region. A gate dielectric extends along the semiconductor sidewalls of the gate groove and separates the gate electrode and the channel region. In the inversion state, the channel extends in a first vertical section from the source region downward along the first sidewall of the gate groove, crosses beneath the gate groove in essentially horizontal direction and extends then in a second vertical section along a second sidewall of the gate groove upward to the drain region. The effective channel length of a RCAT is a function of the depth of the gate groove and the planar distance between the source and the drain region.

At maximum packaging density, the effective channel width of a RCAT is defined through the minimum lithographic feature size. The effective channel width corresponds to the resistance of the transistor in the conducting state ($R_{on}$) and determines the switching characteristics of the memory cell. An extended U-groove transistor with corner gate device (EUD) comprises a gate electrode with corner sections that partly wrap around an edge of a semiconductor lamella that comprises at least a section of the channel region. Near the edge, the electrical fields act on the channel region from two different directions resulting in improved transistor properties.

The corner sections of the gate electrode may extend along further sections of the vertical sidewalls of the semiconductor lamella, wherein, in the inversion state, the channel is formed both along the sidewalls of the gate groove and along sections of the sidewalls on the long sides of the semiconductor lamella. The channel width is increased by the portion of the channel that extends along the sidewalls of the semiconductor lamella. Due to the corners and the increased channel width, EUDs show a low $R_{on}$ and fast switching characteristics.

A need exists for 3D-channel field-effect transistors with further enhanced switching characteristics.

SUMMARY

As described herein, a field-effect transistor comprises a source region, a drain region and a channel region that separates the source and the drain regions. The field-effect transistor further comprises a gate electrode arranged between the source and the drain regions, where a lower edge of the gate electrode is formed below a lower edge of at least one of the source and drain regions, a gate dielectric arranged between the channel region and the gate electrode, a first insulator structure arranged between the gate electrode and at least a section of the source region, and a second insulator structure arranged between the gate electrode and at least a section of the drain region, where at least one of the insulator structures has a greater thickness than the gate dielectric and the first and second insulator structures are asymmetric with respect to each other.

The above and still further features and advantages of the devices and methods described herein will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIGS. 1A-1C illustrate plan and cross-sectional views of an exemplary embodiment of a 3D-channel field-effect transistor with asymmetric insulator structures and a J-shaped channel.

FIGS. 4A-4C illustrate plan and cross-sectional views of a further exemplary embodiment of a 3D-channel field-effect transistor with asymmetric insulator structures, a J-shaped channel and deep corner sections.

FIGS. 5A-5C illustrate plan and cross-sectional views of a further exemplary embodiment of a 3D-channel field-effect transistor with a FinFET-like fully-depleted channel section.

FIGS. 6A-6C illustrate plan and cross-sectional views of another exemplary embodiment of a 3D-channel field-effect transistor comprising a FinFET-like fully-depleted channel section and a shortened Fin.

DETAILED DESCRIPTION

Figure 2C:
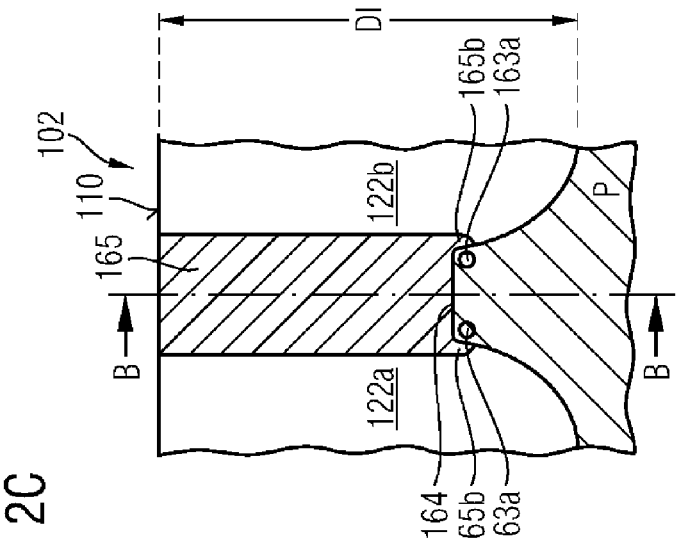
FIGS. 2A-2C illustrate plan and cross-sectional views of another exemplary embodiment of a 3D-channel field-effect transistor with corner sections and a J-shaped channel.

The exemplary embodiments described herein relate to a 3D-channel field-effect transistor, a memory cell, an integrated circuit and an electronic system.

In an exemplary embodiment, a field-effect transistor comprises a source region, a drain region and a channel region, where the channel region separates the source and the drain region. The field-effect transistor further comprises a gate electrode being arranged between the source and the drain region, where a lower edge of the gate electrode is below the lower edge of at least one of the source/drain regions. A gate dielectric is disposed between the channel region and the gate electrode. A first insulator structure is disposed between the gate electrode and at least a section of the source region. A second insulator structure is between the gate electrode and at least a section of the drain region. At least one of the insulator structures is thicker or has a greater thickness than the gate dielectric. The first and the second insulator structures are asymmetric to each other and may differ, by way of example, in at least one geometric dimension or may have different cross-sections.

FIGS. 1A-1C depict a 3D-channel field-effect transistor 101 with J-shaped channel. The field-effect transistor 101 comprises a source region 161 and a drain region 162 which are, by way of example, formed as n$^+$-doped impurity regions within a lightly p-doped section of a semiconductor substrate 100. The semiconductor substrate 100 may be a single crystalline silicon substrate, for example a silicon wafer or a silicon-on-insulator wafer. The semiconductor substrate 100 may include other structures that have previously been fabricated, for example doped and undoped sections, epitaxial semiconductor layers supported by a base semiconductor or a base insulator as well as other semiconductor and insulator structures. The source region 161 and the drain region 162 adjoin a pattern surface 110 of the substrate 100. In a vertical direction perpendicular to the pattern surface 110, the source region 161 extends from the pattern surface 110 to a source depth. The drain region 162 extends from the pattern surface 110 to a drain depth. Between the source region 161 and the drain region 162 a gate electrode 165 is formed below pattern surface 110 such that the source region 161 and the drain region 162 face each other at the gate electrode. The gate electrode 165 is made of a conductive material, for example polycrystalline silicon (polysilicon). Within the substrate 100, a p-conductive channel region 163 may be formed that is in contact with both the drain region 162 and the source region 161. The gate electrode 165 extends between the pattern surface 110 and a device depth Dd. In this exemplary embodiment, the device depth Dd exceeds both the source depth and the drain depth such that a lower edge of the gate electrode 165 is formed below the lower edge of the source region 161 and below the lower edge of the drain region 162.

A first insulator structure 146 is formed between the source region 161 and the gate electrode 165. The first insulator structure 146 has a first width W1 and extends between the pattern surface and a first depth D1 that may correspond to the source depth. A second insulator structure 147 separates the gate electrode 165 and the drain region 162. The second insulator structure 147 has a second width W2 and extends between the pattern surface 110 and a second depth D2 that may correspond substantially to the drain depth. A gate dielectric 164 extends between the lower edge of the first insulator structure 146 and the lower edge of the second insulator structure 147 separating the gate electrode 165 from the channel region 163. In the inversion state, a channel 163a is formed within the channel region 163 and connects the source region 161 and the drain region 162. According to this exemplary embodiment, the channel 163a comprises a short vertical section below the lower edge of the source region 161, a U-shaped section crossing below the gate electrode 165 and a long vertical section below the lower edge of drain region 162.

FIG. 1B shows the resulting, J-shaped channel 163a. The source region 161, the drain region 162 and a portion of the channel region 163 may be formed within a semiconductor lamella 120, as illustrated in FIG. 1A. The semiconductor lamella 120 is a line-shaped semiconductor ridge that extends in a longitudinal direction. The long sides of semiconductor lamella 120 may be parallel to each other as illustrated in this and the following figures. The planar cross section of the lamella 120 may also be a circle, an ellipse or a wedge. According to FIG. 1C, two insulator line structures 122a, 122b face each other at the semiconductor lamella 120 on the long sides. The insulator line structures 122a, 122b may be made of an insulator material, for example a silicon oxide. According to other embodiments, the insulator line structures 122a, 122b may comprise blocking semiconductor structures or complex structures with an insulating function. Referring further to FIG. 1B, the insulator line structures 122a, 122b may extend between the pattern surface 110 and a lamella depth Di that exceeds the device depth Dd.

The field effect transistor 101 is asymmetric with reference to the cross-sectional plane C-C. The first insulator structure 146 and the second insulator structure 147 differ in their geometric dimensions. The thick first insulator structure 146 ensures a high degree of capacitive decoupling of the gate electrode 165 and the source region 161. Providing the second insulator structure 147 thinner than the first insulator structure 146 leaves the remaining cross section of gate electrode 165 large such that a connection resistance to the gate electrode 165 may be reduced. Providing the lower edges of the first and the second insulator structures 146, 147 in different depths may increase the overall channel length at the same device dimensions, whereas the electrical field strength on the critical side, which is in this example the source side, may be decreased by providing a long potential reduction zone on the source side. According to this example, the first and second insulator structure 146, 147 differ in two geometric dimensions, namely width and depth. In other exemplary embodiments, they may differ in one geometric dimension, for example width or depth. The first width may be, by way of example, twice the second width W2. The second depth D2 may be, by way of example, about a third of the first depth D1.

Figure 2B:
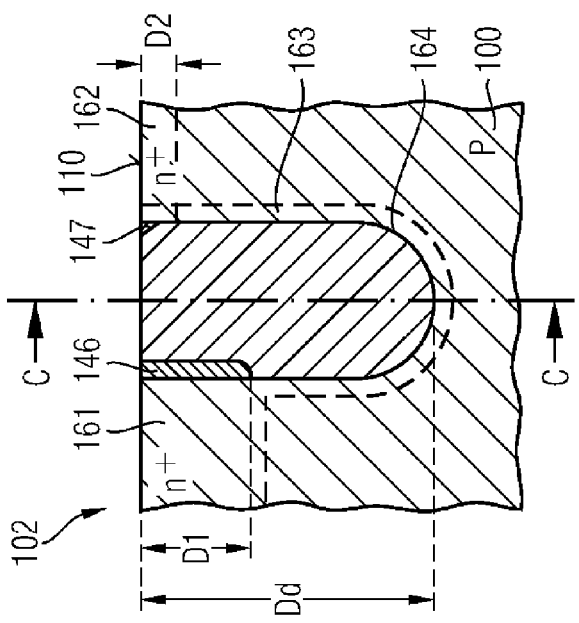
Figure 2A:
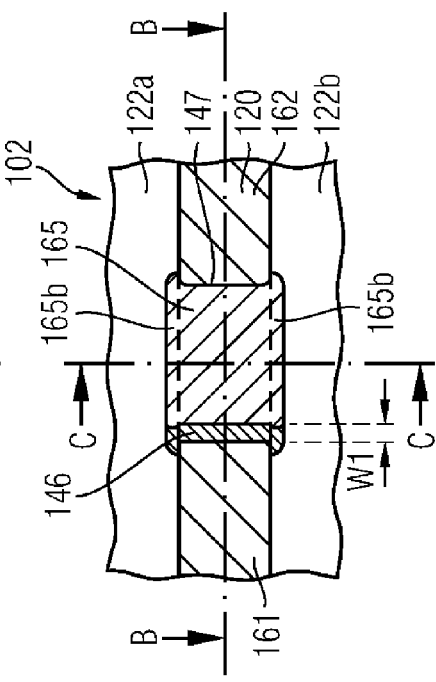

Referring to FIGS. 2A-2C, another exemplary field-effect transistor 102 is illustrated, where the second insulator structure 147 is formed from the gate dielectric 164. Further, as illustrated in FIG. 2B, the gate electrode 165 comprises corner sections 165b that wrap around a corner of the semiconductor lamella 120. The corner sections 165b of the gate electrode 165 extend on the long sides along two U-shaped upper device edges of semiconductor lamella 120. The electrical fields of the corner sections 165b of the gate electrode 165 and a main section of the gate electrode 165 bearing on the upper surface of the semiconductor lamella 120 superpose in the two edge areas that extend along the device edges, resulting in a "corner effect".

By providing the second insulator structure 147 as a portion of the gate dielectric 164, the planar cross section of gate electrode 165 may further be increased and the number of process steps for forming the device may be significantly reduced. A main section of the gate electrode 165 extends between the two insulator line structures 122a, 122b.

Figure 3C:
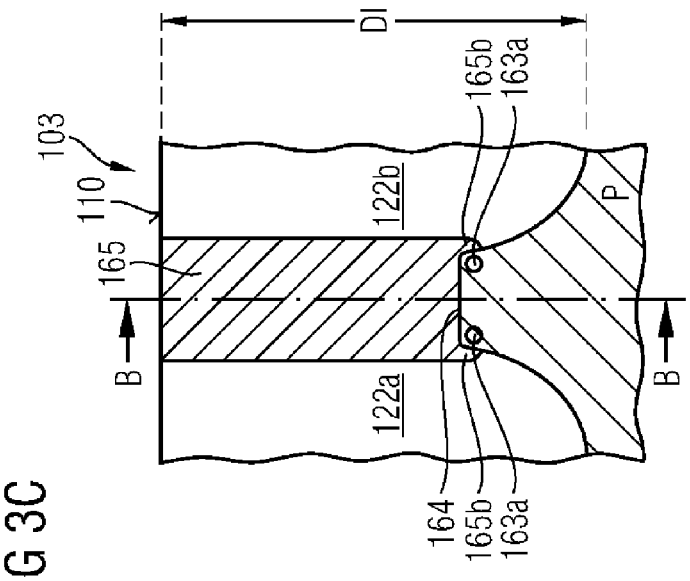
FIGS. 3A-3C illustrate a plan and cross-sectional views of a further exemplary embodiment of a 3D-channel field-effect transistor comprising a Bird's Beak structure as an insulator structure and a J-shaped channel.
Figure 3B:
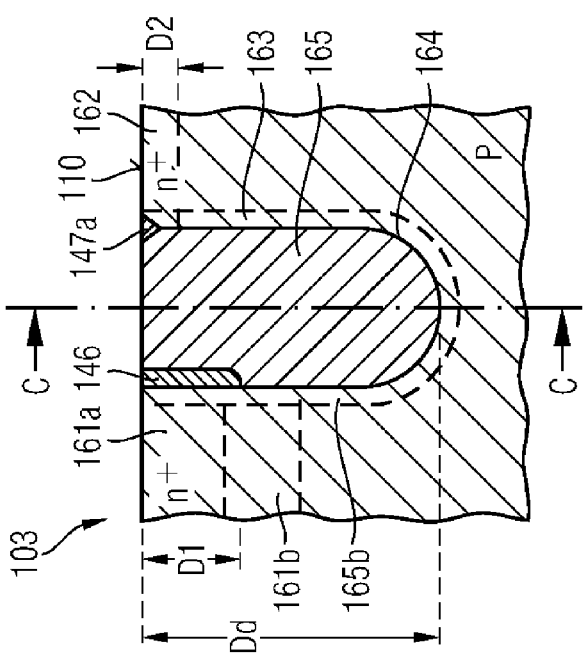
Figure 3A:
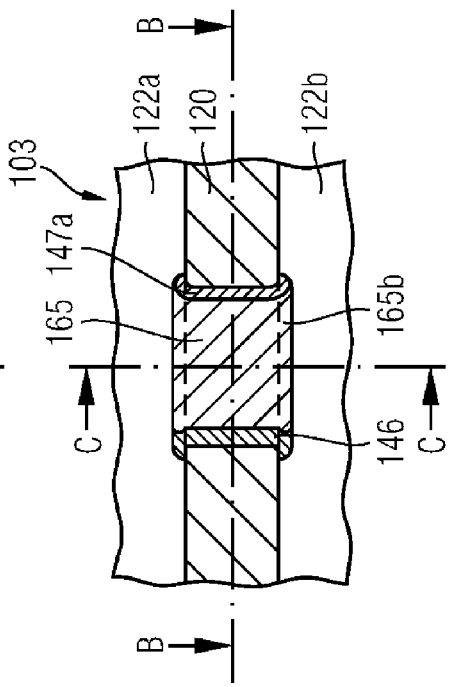

The field-effect transistor 103 as depicted in FIGS. 3A-3C differs from the field-effect transistor 102 of FIGS. 2A-2C in that this embodiment includes a Bird's Beak structure 147a that is formed by thermal oxidation between an upper edge of the gate dielectric 164 and the pattern surface 110. The wedge-shaped Bird's Beak structure 147a may result from an oxidation process occurring along the gate dielectric 164. The Bird's Beak structure 147a widens in a direction of the pattern surface 110 and makes feasible a simple process for decoupling capacitively at least a portion of the drain region 162 and the gate electrode 165.

The source region 161 comprises a heavily doped upper section 161a adjoining the pattern surface 110 and a lightly doped section 161b between the heavily doped section 161a and the channel region 163. A lower edge of the lightly doped section 161b is formed self aligned to the lower edge of the first insulator structure 146. The self aligned formation results in uniform device properties. The lower edge of the heavily doped region 161a may be provided in a non-critical distance to the lower edge of the first insulator structure 146.

The field-effect transistor 104 as illustrated in FIGS. 4A-4C differs from the field-effect transistor 102 as illustrated in FIGS. 2A-2C in that this embodiment includes deeper corner sections 165b of the gate electrode 165, where the channel width may further be increased. As illustrated in FIG. 4B, which shows a cross section perpendicular to the channel direction, the cross-section of the channel 163a comprises a horizontal section below the upper edge of lamella 120, the two edge areas and two vertical sections along the long sides of lamella 120. Further according to this embodiment, the drain depth may be equal to the source depth, the first depth D1 may be equal to the second depth D2 and the first width W1 may be twice the second width W2.

Referring to FIGS. 5A-5C, the field-effect transistor 105 differs from field-effect 104 of FIGS. 4A-4C in that the semiconductor lamella 120 is thinned and forms a thin semiconductor fin 120a that can be fully depleted. The fin 120a may extend substantially from a section of the semiconductor lamella 120 below the lower edge of the source region 161 to a section of the semiconductor lamella 120 below the drain region 162.

In the exemplary embodiment of FIGS. 6A-6C, the thin fin 120a of field-effect transistor 106 is cut through at the source side. The first insulator structure 146 extends between the shortened fin 120a and the source region 161 that may extend to a depth substantially equal to the device depth Dd.

Figure 7:
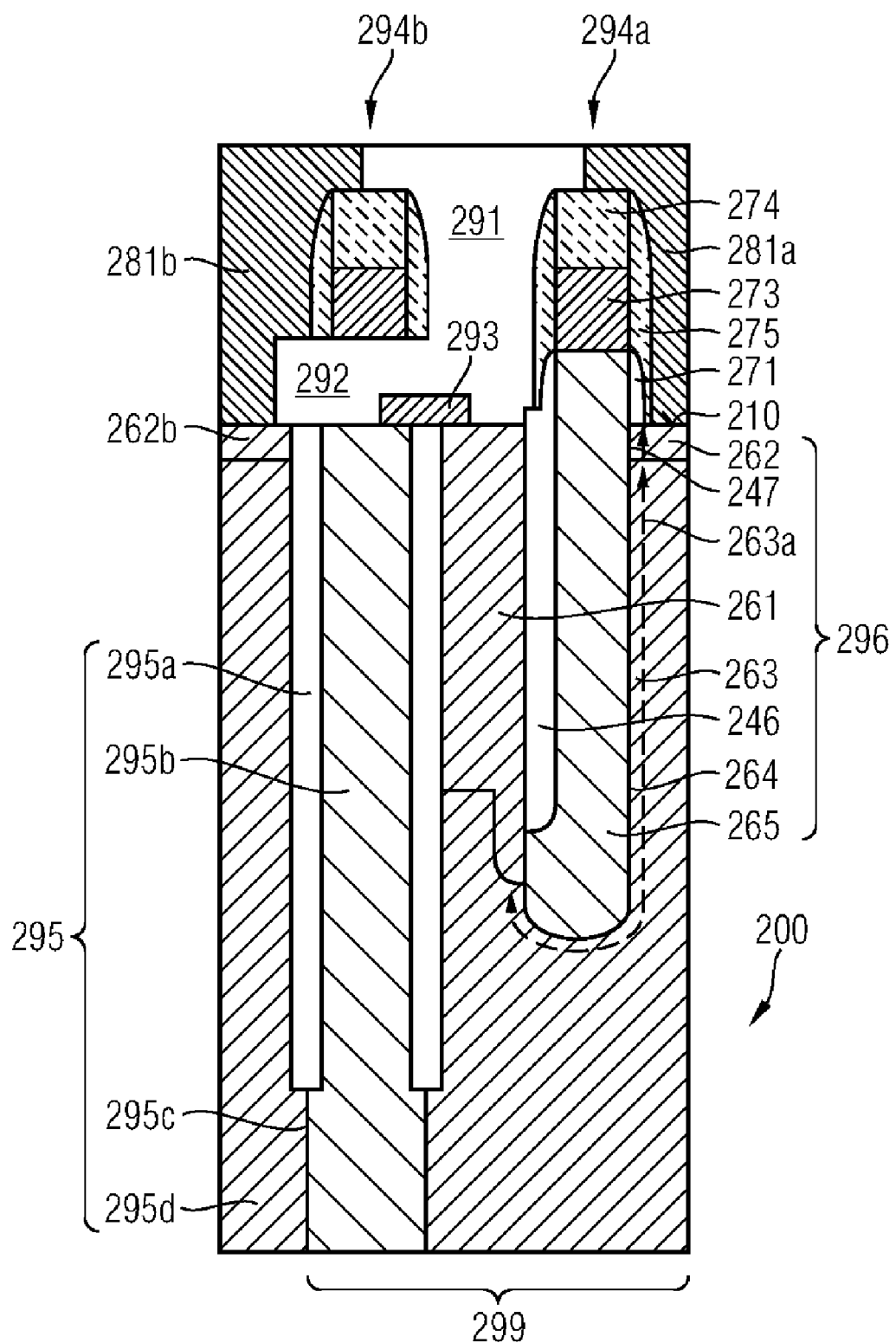
FIG. 7 is a cross-sectional view of an exemplary embodiment of a dynamic semiconductor memory cell comprising a trench capacitor and a field-effect transistor with a vertical channel section and an asymmetric insulator structure.

FIG. 7 illustrates a dynamic memory cell 299 comprising a trench capacitor 295 and an access transistor 296 in a cross-section along a longitudinal axis of the access transistor 296. The access transistor 296 may correspond to the field-effect transistor 103 of FIGS. 3A-3C. An active area comprising a deep n-doped junction as a source region 261, a shallow n-doped junction as a drain region 262, and a p-doped channel region 263 is formed within a semiconductor lamella that may be bordered by two parallel insulator line structures (not shown) facing each other at the lamella along a pitch axis running perpendicular to the longitudinal axis. The source region 261 and the drain region 262 face each other at a gate electrode 265. A lower edge of the gate electrode 265 may be deeper than the lower edge of the drain region 262. A channel 263a that is formed in the inversion state of access transistor 296 may be J-shaped and extends between the lower edges of source region 261 and drain region 262 and in sections beneath the lower edge of gate electrode 265.

A thick first insulator structure 246 separates the gate electrode 265 and the heavily doped section 261b of source region 261. A gate dielectric 264 separates the gate electrode 265 from the channel region 263. A further portion of gate dielectric 264 may form a second insulator structure 247 separating the gate electrode 265 and the drain region 262. A portion of the gate electrode 265 protrudes above a pattern surface 210 of the substrate 200. A first spacer 271 covers a vertical sidewall of the protrusion. Line-shaped word lines 294a, 294b comprising in each case a conductive layer 273 that bears in sections on the protrusions and a dielectric cap layer 274 covering the conductive layer 273 extend along the pitch axis and connect in each case a plurality of gate electrodes 265 arranged in a row along the pitch axis. Second spacers 275 cover vertical sidewalls of the word lines 294a, 294b.

The trench capacitor 295 comprises a node electrode 295b comprising a conductive material, for example heavily doped polysilicon, a metal or a conductive metal compound, a counter electrode 295d that may be formed as a heavily doped buried plate within semiconductor substrate 200, a thin capacitor dielectric 295c separating the node electrode 295b and the counter electrode 295d, and a thick insulator collar 295a insulating the node electrode 295b from neighboring access transistors. In this exemplary embodiment, the node electrode 295b is connected to the source region 261 via a conductive surface strap 293 bearing in sections on the upper edges of the node electrode 295b and the source region 261. An insulator cap 292 encapsulates surface strap 293. In further embodiments (not shown), the insulator collar 295a may be recessed asymmetrically such that a single sided buried strap connects directly the node electrode 295b and the neighboring source region 261. Contact structures 281a, 281b penetrating an interlayer dielectric 291 that fills the spaces between the word lines 294a, 294b access the drain sections 262, 262b and connect each drain section 262, 262b to a corresponding bit line (not shown). In trench capacitor type memory cells, the storage capacitors are buried in the substrate in which the access transistors are formed as described above. In stacked capacitor type memory cells, to which further embodiments may refer to, the capacitors may be placed above the access transistors.

The memory cells 299 may be arranged in a matrix comprising lines extending along the longitudinal axis and rows that extend along the pitch axis. The matrix may be configured as a checkerboard where, along both axes, the storage capacitors 295 and access transistors 296 are arranged alternately. Alternatively, the drain regions 262 of each two memory cells may be merged, where the two corresponding memory cells face each other mirror inverted at a common drain region. Pairs of access transistors 296 and pairs of storage capacitors are arranged alternately along both axes.

Figure 8:
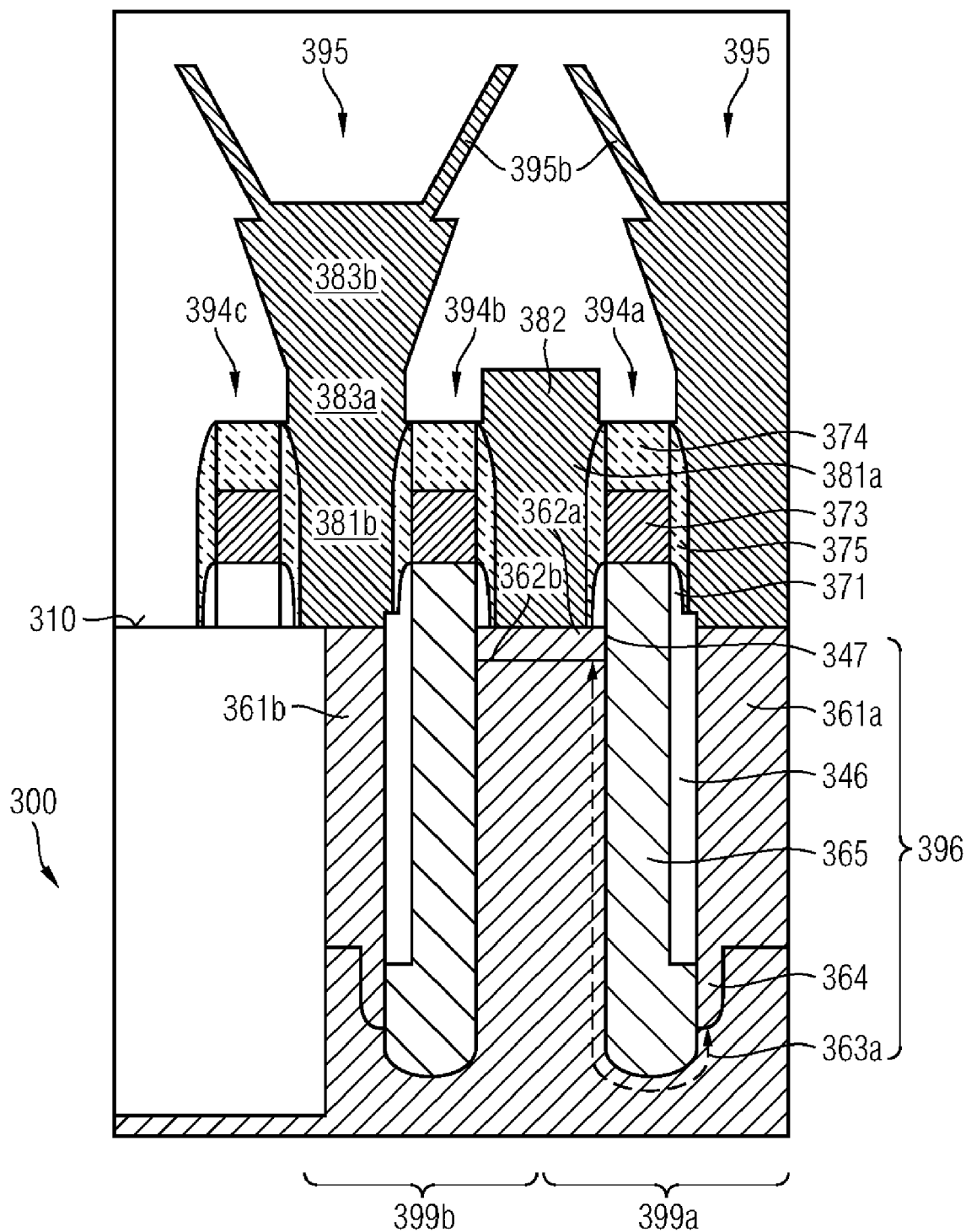
FIG. 8 is a cross-sectional view of an exemplary embodiment of a pair of dynamic semiconductor memory cells comprising a stacked capacitor and a field-effect transistor with a vertical channel section and an asymmetric insulator structure.

FIG. 8 illustrates two dynamic memory cells 399a, 399b, each of them comprising a stack capacitor 395 and an access transistor 396, in a cross-section along a longitudinal axis of the access transistors 396. Each access transistor 396 may correspond to the access transistor 296 of FIG. 7, where the access transistors 396 share a common drain region 362a, 362b and where the access transistors 396 are arranged mirror inverted with reference to a mirror plane extending vertical to the pattern surface 310 and along the pitch axis in the middle of a common drain region 362a, 362b. The description of the access transistors 396 may correspond to that of access transistor 296 of FIG. 7 with reference numbers being incremented by 100, respectively. A shared contact structure 381 connects the common drain region 362a, 362b to a bit line 382 extending along the pitch axis above word lines 394a, 394b. Further contact structures 381b connect the source regions 361a, 361b via further contact pad structures 383a, 383b with a storage electrode 395b of stack capacitor 395. Each stack capacitor 395 comprises a capacitor dielectric (not shown) covering the storage electrode 395b and a counter electrode (not shown) covering the capacitor dielectric.

Figure 9A:
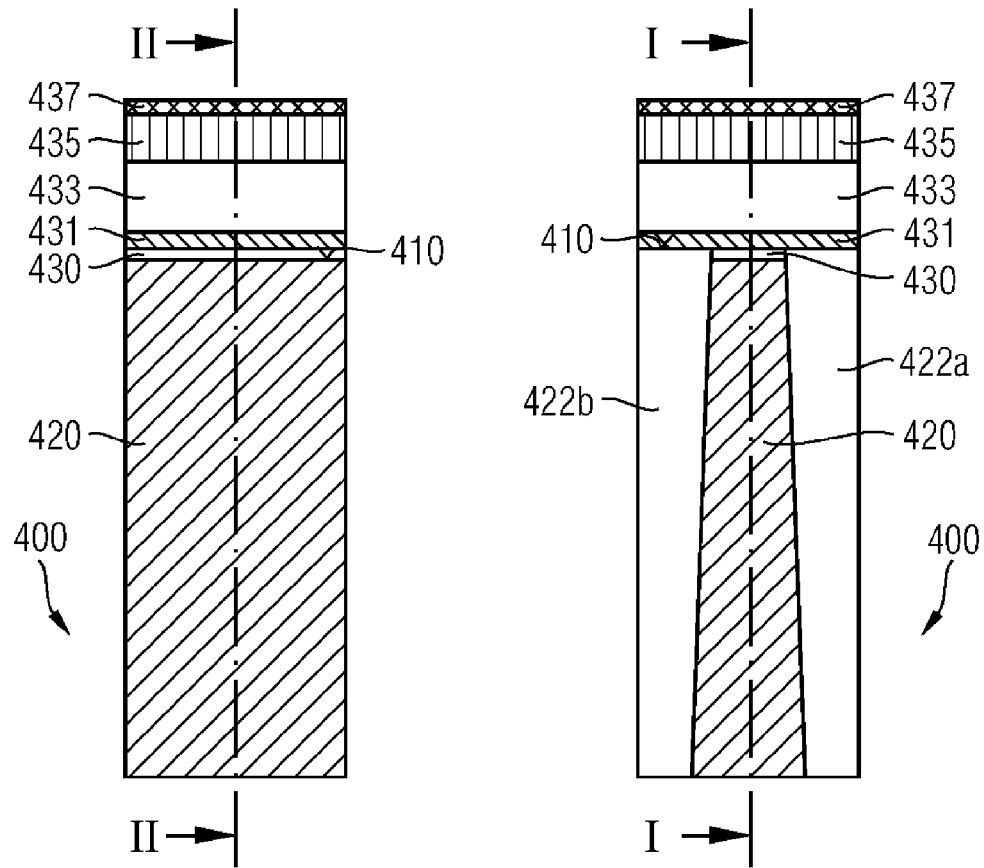
FIGS. 9A-9R illustrate an exemplary method of fabricating a field-effect transistor, in which a sequence of cross-sectional views is depicted of a portion of a semiconductor substrate in different stages of manufacturing.
Figure 9B:
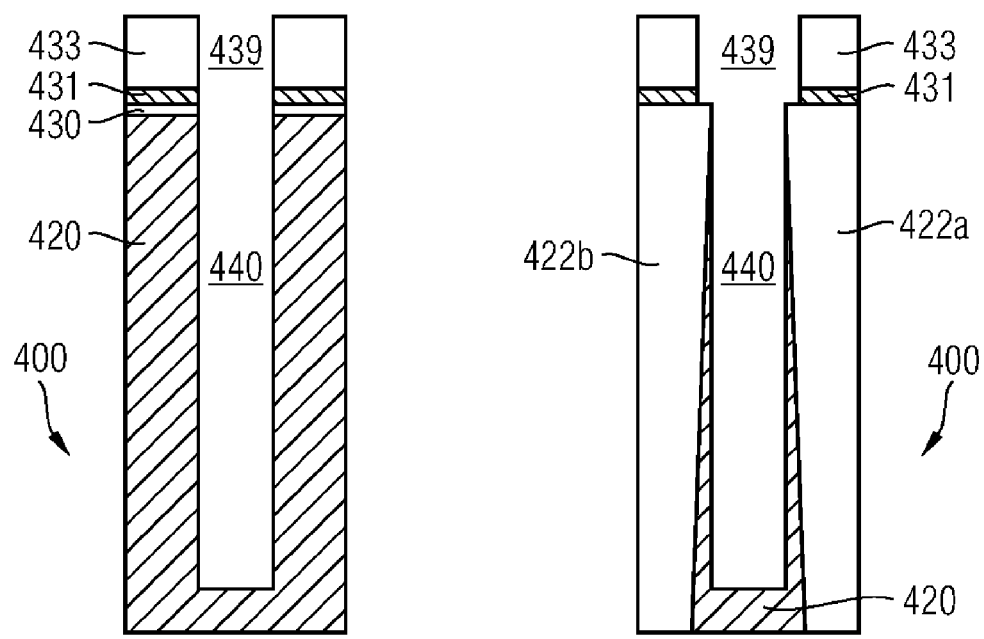
Figure 9C:
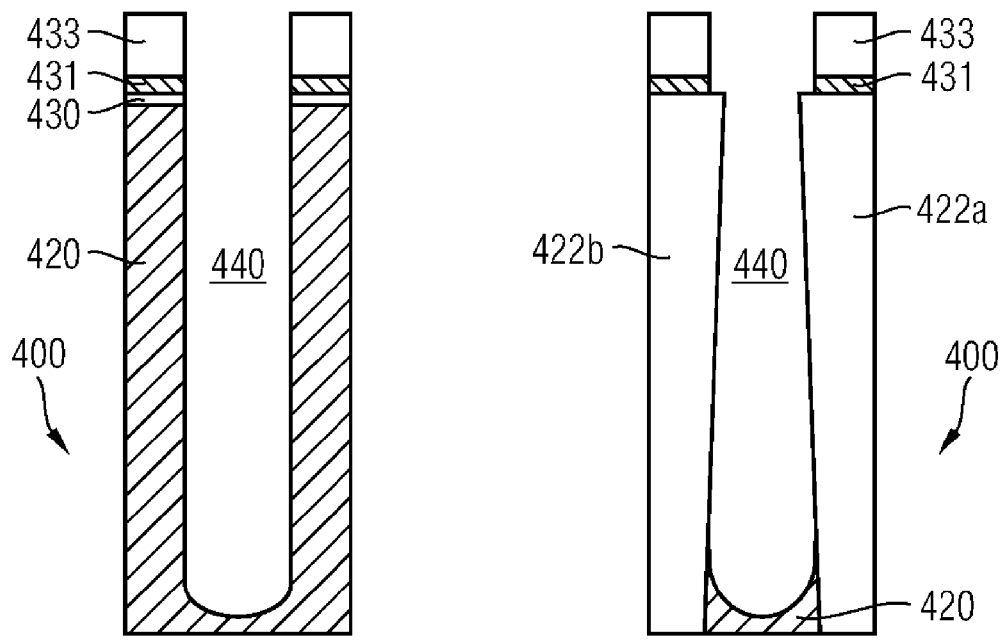
Figure 9D:
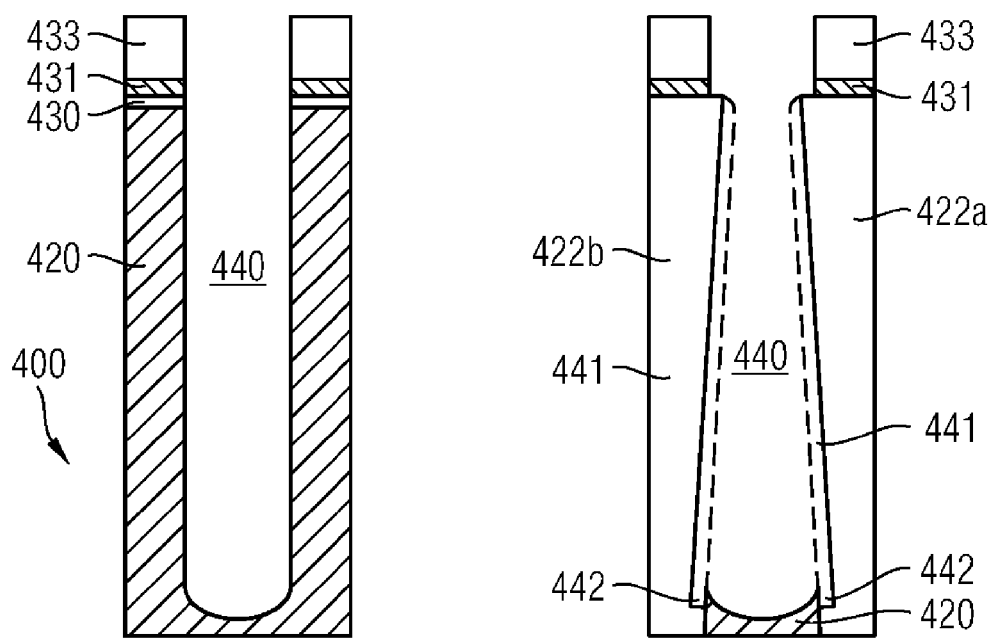
Figure 9E:
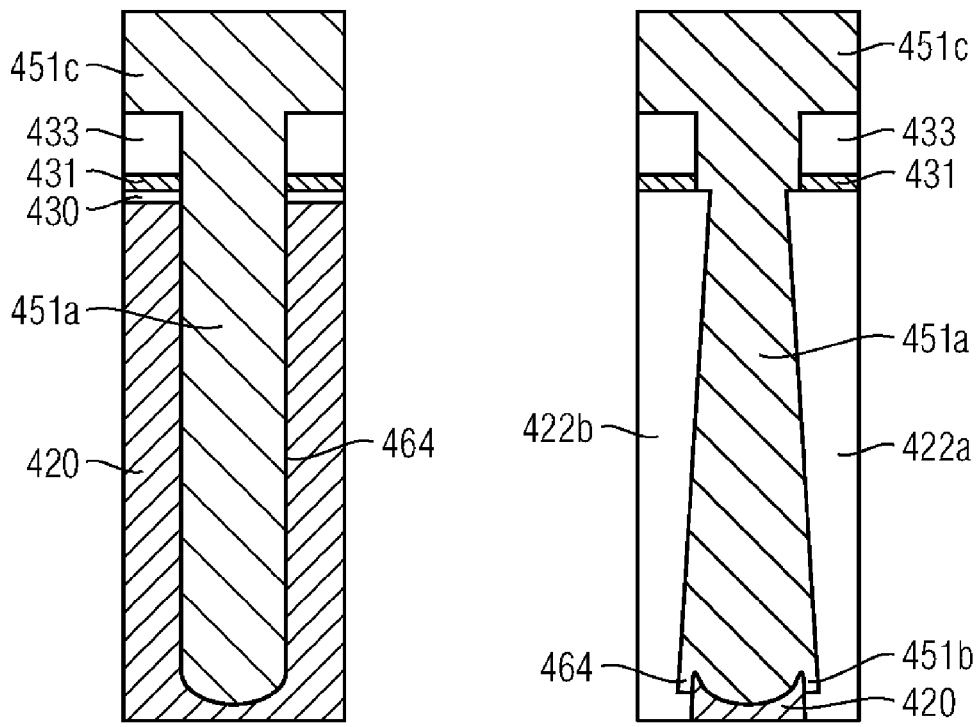
Figure 9F:
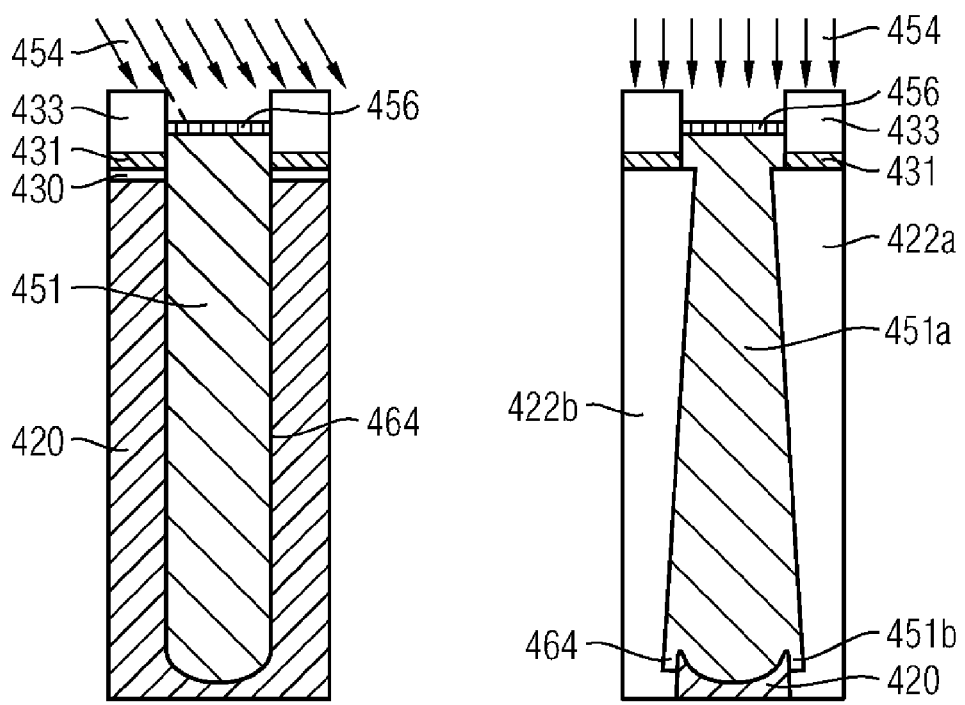
Figure 9G:
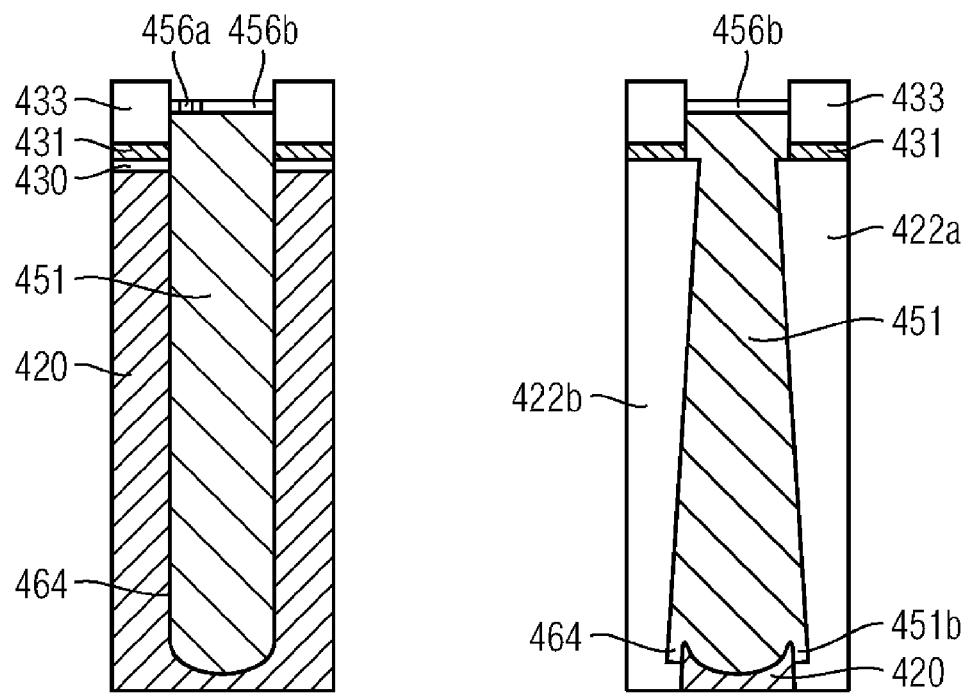
Figure 9H:
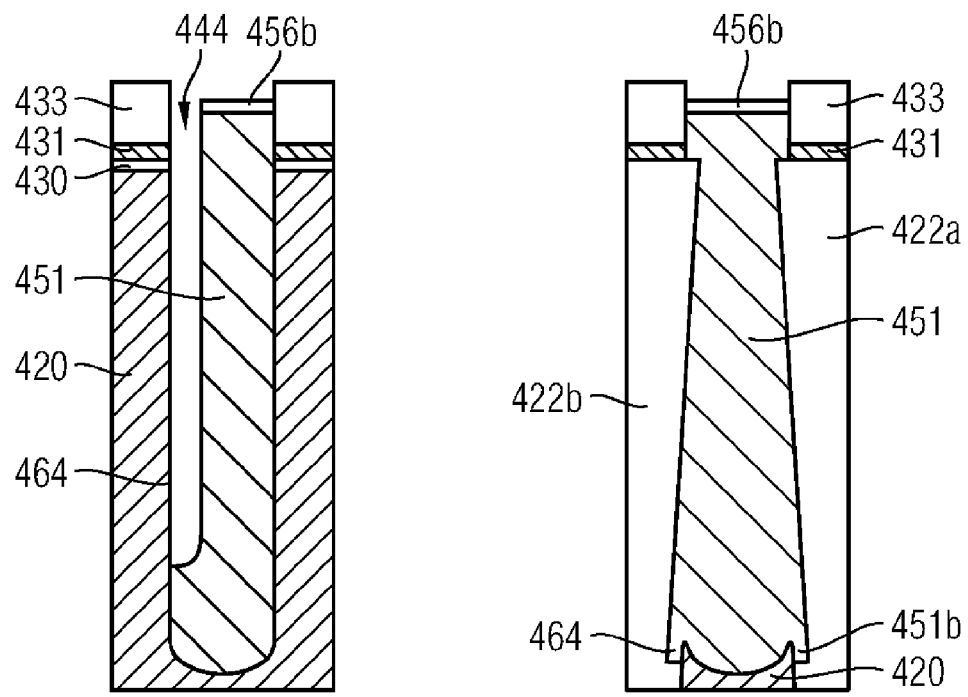
Figure 9I:
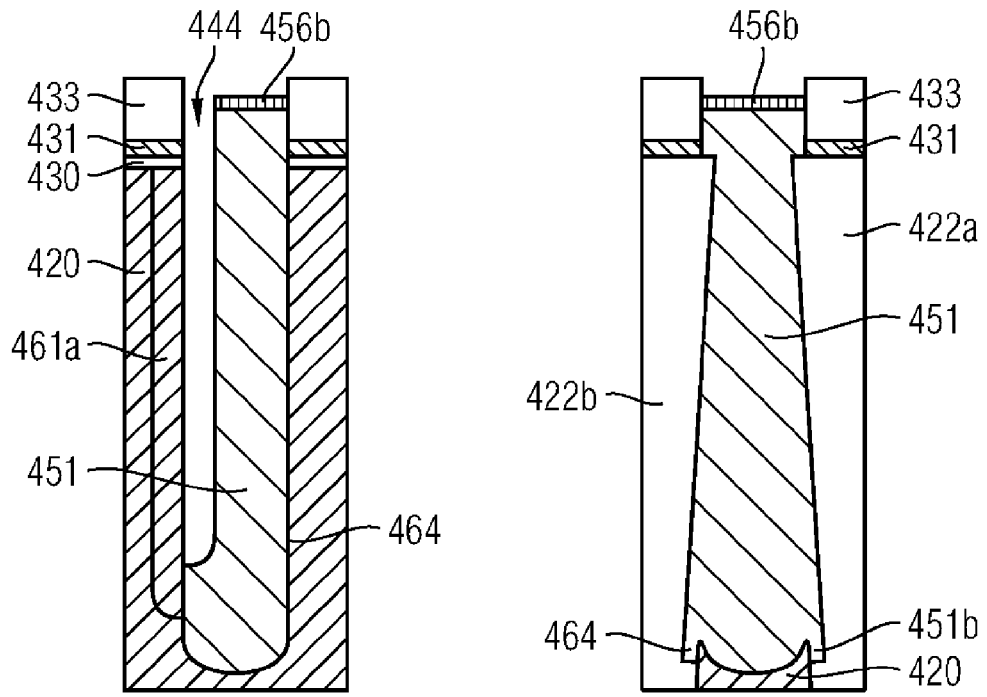
Figure 9J:
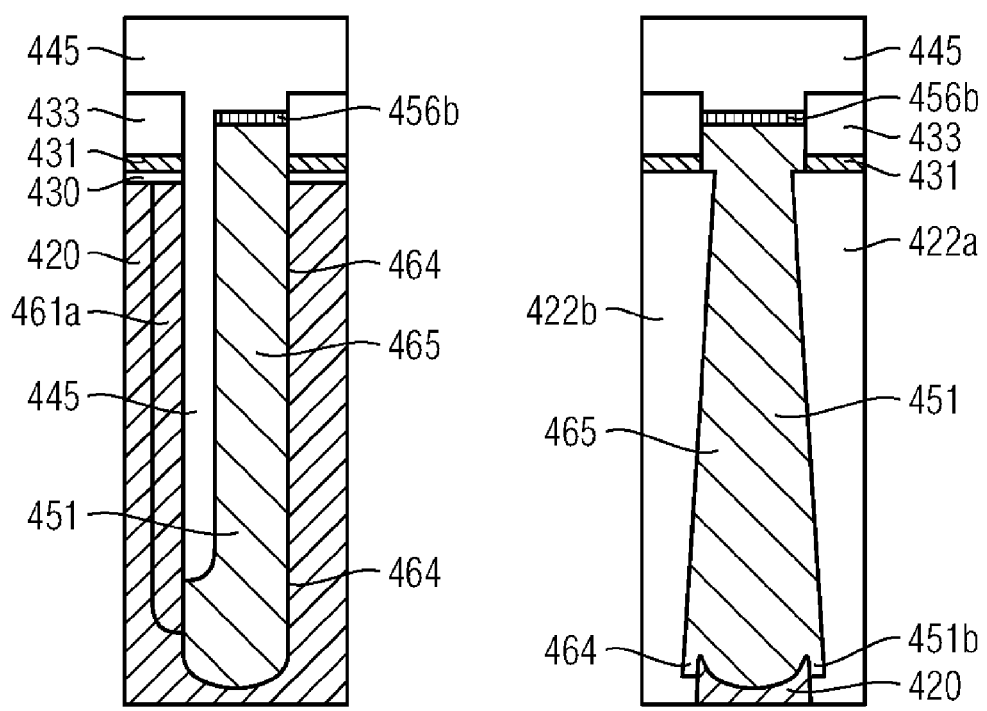
Figure 9K:
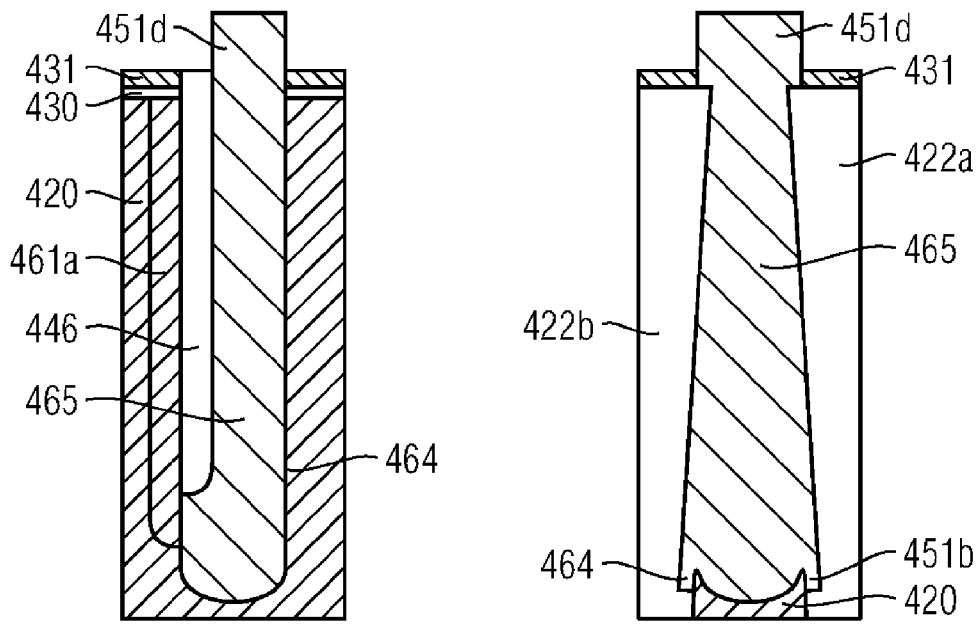
Figure 9L:
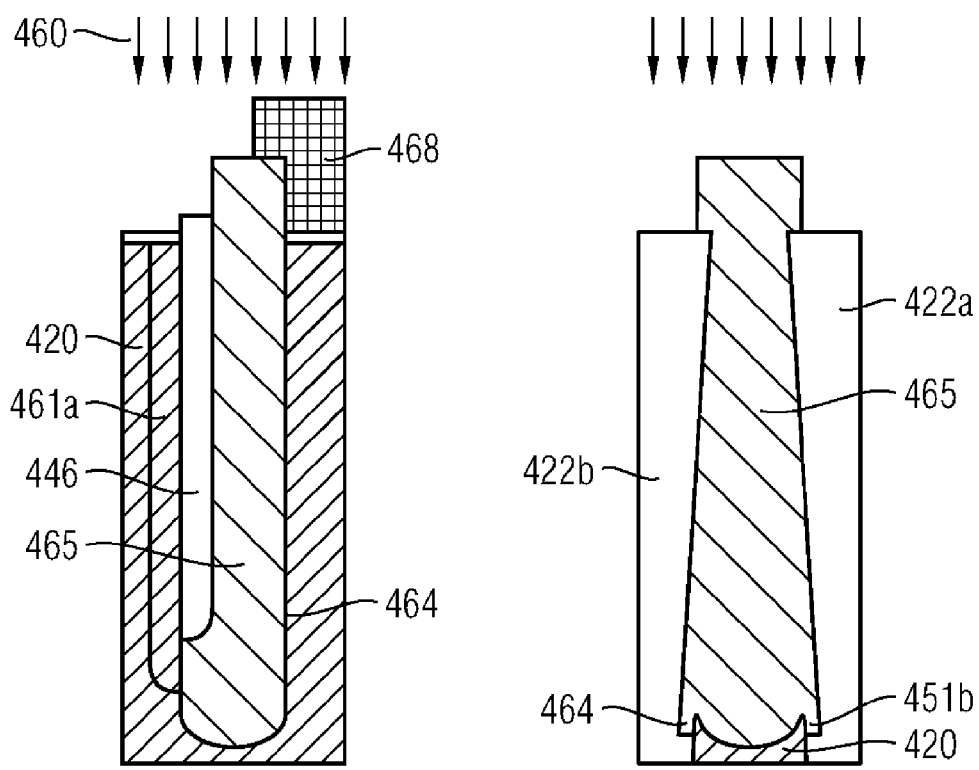
Figure 9O:
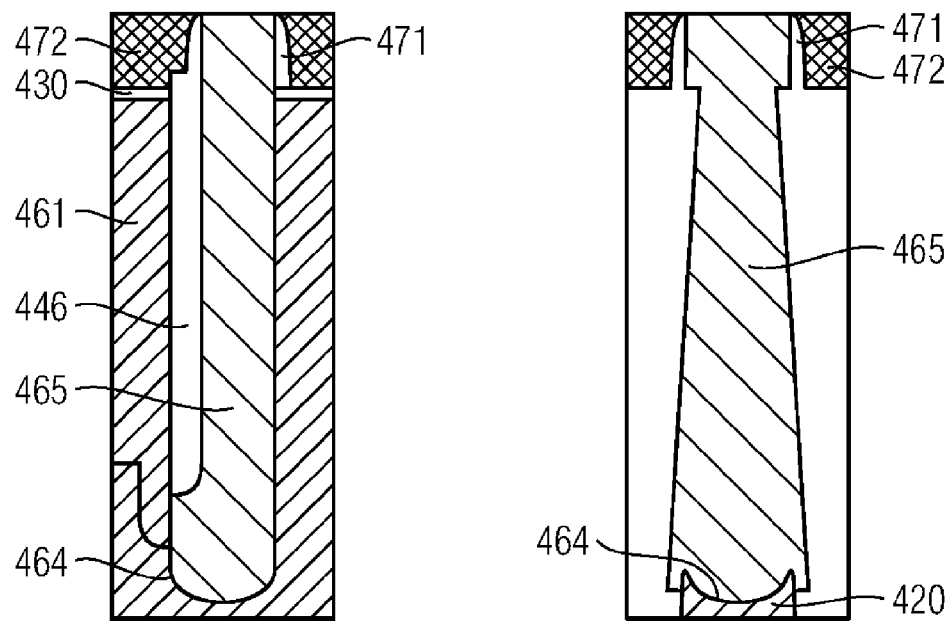
Figure 9P:
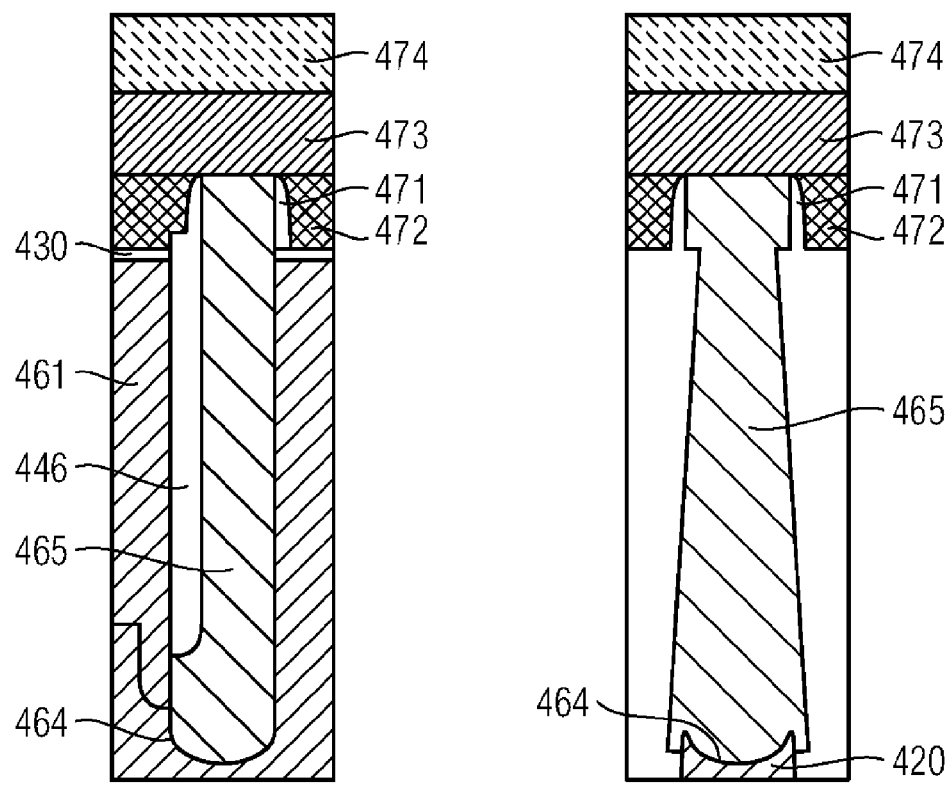
Figure 9Q:
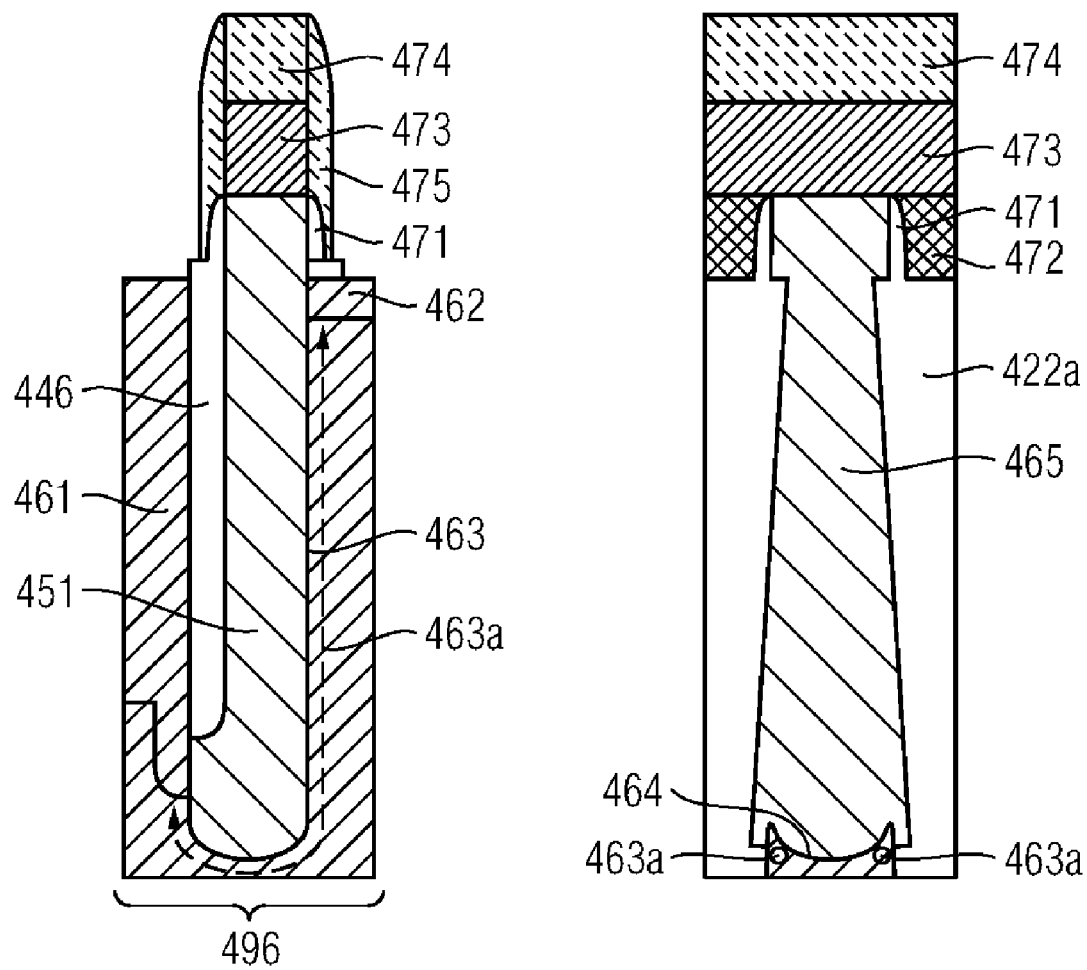
Figure 9R:
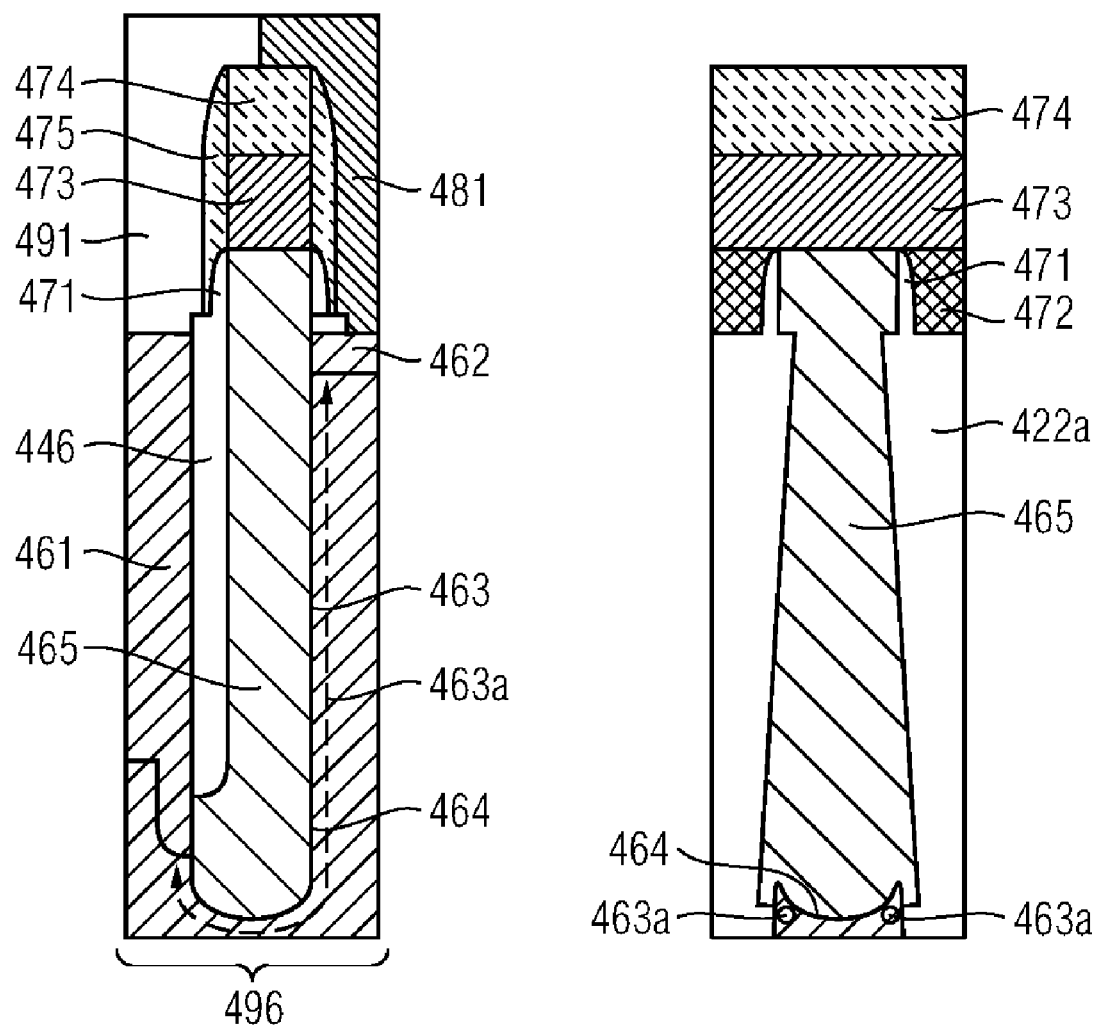

FIGS. 9A to 9R relate to a method of manufacturing an asymmetric field-effect transistor with a J-shaped channel, where the channel comprises at least one vertical section with respect to a pattern surface 410 of a semiconductor substrate 400. A field-effect transistor with a channel comprising vertical and horizontal channel sections is commonly referred to as a three dimensional channel (3D-channel) transistor device. Each figure shows two cross-sectional views that are perpendicular to each other, where each left cross-section runs along a sectional line I-I of the corresponding right cross-sectional view and each right cross-section runs along a sectional line II-II of the corresponding left cross-sectional view.

The design requirements for the two source/drain regions of the field-effect transistor may differ from each other in asymmetric applications of the transistor. An example for an asymmetric application of a field-effect transistor is the access transistor of a DRAM cell. With regard to dynamic memory cells as described above, the capacitor of the memory cell is charged and discharged via the access transistor, where the source/drain region that is connected to the storage electrode of the capacitor is hereinafter referred to as the source region and the source/drain region that is connected to the bit line is hereinafter referred to as the drain region, notwithstanding the fact that the source region may also be regarded as "drain" and the drain region may also be regarded as "source" depending upon the mode of operation of the memory cell. The requirements concerning the "source" region and the "drain" region may differ due to a more critical field strength or leakage current issue or to a more critical capacitive coupling concerning the storage node.

A method of manufacturing a 3D-channel field-effect transistor may comprise forming a groove in a semiconductor substrate and disposing a fill material in a lower section of the groove. A top mask covering a first portion of the fill material and leaving a second portion exposed may then be provided. The second portion of the fill material may be recessed to form a gap between the semiconductor substrate and the first portion of the fill material. A first insulator structure may then be provided in the gap.

Referring to FIG. 9A, a substrate 400 is provided, for example a silicon wafer comprising a single crystalline silicon portion 420 that may be lightly p-doped at least in an upper section oriented to a pattern surface 410 of the substrate 400. At least two parallel insulator line structures 422a, 422b, each of them bordering on the pattern surface 410 may be formed within substrate 400. The insulator line structures 422a, 422b may be silicon oxide structures. Since the insulator line structures 422a, 422b may result from filling trenches being etched into substrate 400, the insulator line structures 422a, 422b may taper with increasing depth. The two parallel neighboring insulator line structures 422a, 422b face each other at an interposing and adjacent semiconductor lamella 420, where the semiconductor lamella 420 may have a width corresponding to a minimum lithographic feature size for periodic line structures. The semiconductor lamella 420 extends along a longitudinal direction parallel to the cross section I-I. In an exemplary embodiment, the width of lamella 420 is less than 70 nanometers. Within the semiconductor lamella 420, an active area of the field-effect transistor may be formed in the following manner.

A protective liner 430 that may comprise or consist of silicon oxide may be formed by thermal oxidation or deposition on substrate 400 at least in sections that are formed by the semiconductor lamella 420. The protective liner 430 may have a thickness of about 40 nanometers or less. An etch stop liner 431 may be deposited on the pattern substrate 410 or on the protective liner 430. The etch stop liner 431 may comprise or consist of silicon nitride and may have a thickness of 40 nanometers or less. A spacer layer 433 may be deposited on the etch stop liner 431. The material of the spacer layer 433 may be selectively removed against the semiconductor lamella 420 and the etch stop liner 431. The spacer layer 433 may be a silicon oxide layer that is deposited through a low pressure chemical vapor deposition (LPCVD) process and may have a thickness of about 40 to 60 nanometers. A mask layer 435 for patterning the spacer layer 433 may be deposited on the spacer layer 433.

The material of the mask layer 435 is selected such that the spacer layer 433 is selectively removed against it and such that mask layer 435 may be removed in course of patterning a semiconductor portion of substrate 400. The mask layer 435 may be a polycrystalline silicon (polysilicon) layer. A resist layer 437 may be provided on mask layer 435.

Referring to FIG. 9B, the resist layer 437 is patterned via photolithographic techniques. By developing the resist layer 437 after exposure, an opening is formed first in the resist layer 437, then transferred into mask layer 435 and then transferred from mask layer 435 into spacer layer 433. The cross section of the resulting opening 439 in the spacer layer 433 may be a circle or an ellipse with different dimensions along the cross sectional lines. The etch stop liner 431 and the protective liner 430 are etched through and perforated. Using an anisotropic etch, which may include a reactive ion beam etch process, the opening 439 is transferred into the exposed section of the semiconductor lamella 420.

As shown in FIG. 9B, a groove 440 results in the semiconductor lamella 420. The groove 440 extends in an upper portion from a first insulator line structure 422a to the opposing insulator line structure 422b. In a lower section of groove 440, residues of the semiconductor lamella 420 may remain on opposing sidewalls of the insulator line structures 422a, 422b. The patterned resist layer 437 and residues of the mask layer 435 are removed from the surface of the spacer layer 433. The cross section of the groove 440 results from the overlap of the opening 439 and the semiconductor lamella 420. The depth of the groove may be greater than the width of the lamella, for example at least a quintuple of the width of the lamella. In an exemplary embodiment, the depth of the groove is at least 200 nanometers.

With reference to FIG. 9C, the groove 440 may be extended via an isotropic etch that is effective on the semiconductor material of the semiconductor lamella 420. The etch process may be a plasma enhanced etch process. FIG. 9C shows the extended groove 440, where semiconductor residues are removed from the sidewalls of the insulator line structures 422a, 422b in course of the etch. A bottom portion of the groove 440 becomes U-shaped along the longitudinal axis and the pitch axis.

According to FIG. 9D, which refers to an exemplary embodiment, an additional isotropic etch, which is effective on the material of the insulator line structures 422a, 422b may be performed to form an insulator recess 441 extending the groove 440 along the pitch axis. In the U-shaped bottom portion of the groove 440, outer sidewalls of the semiconductor lamella 420 are partially exposed by insulator divots 442 such that two edges of the semiconductor lamella 420 are exposed. Each edge runs along the inner sidewalls of the groove 440 and along the longitudinal axis. In other embodiments this isotropic etch of the insulator line structures 422a, 422b may be omitted.

With regard to FIG. 9E, a gate dielectric 464 is provided on exposed sections of the semiconductor lamella 420. The gate dielectric 464 may be formed through thermal oxidation of the semiconductor material of the lamella 420 or through deposition of a conformal dielectric liner and may have a thickness of about 3 to 6 nanometers. A fill material 451 such as doped polycrystalline silicon (polysilicon) is deposited, for example via a chemical vapor deposition process.

FIG. 9E shows the gate dielectric 464 covering the semiconductor lamella 420 in sections that correspond to those sections of lamella 420 that are exposed by the groove 440 in FIG. 9D. A fill portion 451a of the fill material 451 fills a main portion of the groove 440. A corner portion 451b may fill the insulator divots 442 such that the fill material 451 adjoins both edges of lamella 420 on different sides respectively. An overfill portion 451c covers the spacer layer 433. The fill portion 451a and the corner portion 451b may form a gate electrode of the field-effect transistor. The fill material 451 may be a conductive material, for example heavily doped polysilicon.

Referring to FIG. 9F, the fill material 451 is recessed, wherein the overfill portion 451c may be removed and an upper edge of the fill portion 451a may be drawn back from the upper edge of the spacer layer 433. The recess is controlled such that the distance between the upper edges of spacer layer 433 and the residual fill portion 451a corresponds to a predetermined distance. A top mask liner 456 is then formed on top of the fill portion 451a. The material of the top mask liner 456 may be selected such that the etch resistance of a doped portion is different from that of an undoped portion. According to exemplary embodiments, the etch properties of the top mask material are alterable by implanting suitable ions. The top mask liner 456 may comprise silicon. According to other embodiments, the top mask material is removable through a suitable sputter-like implantation process and is, for example, a silicon nitride liner. The top mask liner 456 may be grown thermally on the exposed surface of fill portion 451a and may have a thickness of 10 nanometers or less.

FIG. 9F shows the top mask liner 456 covering an upper edge of the recessed fill portion 451a. The top mask liner 456 is exposed to an angled ion implantation 454 with an implantation axis that is oblique to a pitch plane extending along the pitch axis and perpendicular to the pattern surface 410. A portion of the top mask liner 456 in a blind area of the ion beam is shielded against the implantation.

As illustrated in detail in FIG. 9G, a first section 456a of the top mask liner 456 that is shielded by the upper edge of spacer layer 433 remains undoped or undamaged. A second section 456b of the top mask liner 456 that is exposed to the ion beam is doped, damaged or removed. The implant may be a Halogen implant of sufficient energy to damage the top mask liner 456. The length of the first section 456a is adjustable through the predetermined distance and the inclination of the implantation axis.

With regard to FIG. 9H, the first section 456a may be removed selectively against the second section 456b. The second section 456b forms a top mask that covers a first portion of the fill material 451 and that may act as an etch mask in a following anisotropic etch process that is effective on an exposed second portion of the fill material 451. The anisotropic etch process may be a reactive ion beam etch process.

According to a further embodiment, the second section 456b may be removed selectively against the first section 456a. A silicon oxide mask may be grown on the exposed section of the recessed fill portion 451a. Then the first section 456a may be removed and the recessed fill portion may be etched using the silicon oxide mask as the top mask.

As shown in FIG. 9H, a gap 444 is formed beneath former first section 456a. The gap 444 separates the first portion of the fill material 451 and the semiconductor lamella 420 and extends along a section of an inner surface of the groove 440. The second portion 456b of the top mask liner 456 or the silicon oxide mask shields the first portion of the fill material 451.

According to FIG. 9I, a first section 461a of a source region of the field-effect transistor may be formed in a section of the lamella 420 that is accessible via the gap 444. The first section 461a may be formed by outdiffusion from the gaseous phase. A lower edge of the first section 461a is aligned to the lower edge of the gap 444. The capacitive coupling between the source region and the gate electrode and a low resistive connection between the channel and the source region may be achieved. The first section 461a may be a low-doped section of the source region.

The processes described in FIGS. 9F to 9I may be repeated at the opposite side of the groove to form a second insulator structure, wherein at least one of width and depth of another gap may differ from that of the gap 444. A field-effect transistor as illustrated in FIGS. 1A to 1C may be manufactured in this way.

With regard to FIG. 9J, an insulator material 445 may be deposited, where the insulator material 445 fills the gap 444 completely. FIG. 9J shows the insulator material 445 filling the gap 444 and covering the spacer layer 433 and the second sections 456b of the top mask liner 456 in the rest. The insulator material 445 may be a silicon oxide deposited via a process with sufficient gap fill properties, for example a spin-on-glass. The recessed fill portion 451a and the corner portion 451b of the fill material 451 form a gate electrode 465 of the field-effect transistor. According to another embodiment, the gap 444 may not completely be filled but covered by a dielectric cap layer that may be provided in an upper portion of the gap 444. A remaining void forms an insulator structure separating the gate electrode 465 and the first source section 461a. The void ensures a minimal coupling capacity between the source region 461 and the gate electrode 465. Due to the formation of the insulator structure in a narrow gap, the method opens up the possibility to form the insulator structure 446 as a void with minimal coupling capacity. According to a further embodiment, the insulator structure comprises thermally grown silicon oxide. The gate electrode 465 may be formed in one single continuous deposition process without a deposition interface between a first fill portion and a second fill portion.

As shown in FIG. 9K, portions of the insulator material 445 outside the gap 444, and the spacer layer 433 may be removed via a selective etch process, wherein the etch stop liner 431 may act as an etch stop or an etch stop signal source. In an exemplary embodiment, the etch stop liner 431 is a silicon nitride liner, whereas the spacer layer 433 and the insulator material 445 are based on silicon oxide. A suitable etch process may be a reactive ion beam etch process. The residual insulator material filling the gap 444 forms an insulator structure 446 that extends along one of the vertical interface planes between former groove 440 and semiconductor lamella 420. The insulator structure 446 separates the gate electrode 465 from a section of the low doped first source section 461a. A top portion 451d of the gate electrode 465 projects above the pattern surface 410.

Referring to FIG. 9L, an implant mask 468 may be formed on the pattern surface 410, where the implant mask 468 shields the sections of the semiconductor lamella 420 in which the drain region is formed and exposes that area of semiconductor lamella 420 that is assigned to the source region 461. A straight implant 460 with no inclination toward pattern surface 410 may be performed. The implant mask 468 is removed. Then the etch stop liner 431 may be removed.

According to FIG. 9M, a second, heavily doped section 461b of the source region 461 results from the implantation 460 in the semiconductor lamella 420. The second section 461b overlaps in sections the first section 461a. In an exemplary embodiment, the lower edge of heavily doped section 461b does not fall below the lower edge of the insulator structure 446 such that the insulator structure 446 may insulate completely the heavily doped section 461b from the gate electrode 465. A potential reduction zone, within which a potential applied to an upper edge or upper region of the source region 461 is reduced towards the lower edge, is capacitively decoupled from the gate electrode 465. The lower edge of the source region 461 may be formed self-aligned to the lower edge of the insulator structure 446, due to the fact that the formation of the lightly doped section 461a is aligned to the edges of gap 444.

Referring to FIG. 9N, a thermal oxidation process may be performed in order to support the formation of a Bird's Beak structure (not shown) at the edge of the gate dielectric 464 to the protective liner 430. The Bird's Beak structure forms a wedge-shaped junction between a narrow and a thick silicon oxide structure. The Bird's Beak structure may be formed on the edge between the gate dielectric 464 and the protective liner 430 on the drain side. This Bird's Beak structure may reinforce the gate dielectric 464 between the gate electrode 465 and the drain region to reduce a gate induced leakage current.

First spacers 471 may be formed along the vertical sidewalls of top portion 451d. In a memory cell array including a plurality of identical or similar transistors, the top portions 451d form protrusions or dots of the fill material 451 projecting above the pattern surface 410. The protrusions 451d may be arranged in a matrix of lines and rows. The first spacers 471 encapsulate the vertical sidewalls of the protrusions 451d. The material of the first spacers 471 is, for example, a silicon oxide.

According to FIG. 9O, a planarizing material may be deposited that fills the space between the encapsulated protrusions 451d. The 3D-topology may be planarized by recessing portions of the planarizing material that project above the upper edge of the protrusions 451d through a chemical mechanical polishing process that stops on the upper edge of the protrusions 451d. The remaining planarizing material forms a base layer 472 filling the space between the protrusions 451d. The planarizing material may be conductive, for example undoped polysilicon, that may be deposited through a LPCVD process.

As shown in FIG. 9P, a conductive layer 473, for example a layer containing a metal or a conductive metal compound, may be deposited upon the base layer 472 and the exposed upper edges of the protrusions 451d. The conductive layer 473 may also comprise a layer stack with layers of conductive and dielectric materials that may in each case serve as low-resistance connection layer, barrier layer and/or adhesive layer. A dielectric cap layer 474, for example a silicon nitride layer, may be disposed on the conductive layer 473.

Referring to FIG. 9Q, the layer stack comprising the cap layer 474, the conductive layer 473 and the base layer 472 including protrusions 451d is patterned using lithographic techniques and a hard mask, where a plurality of parallel line-shaped word lines is formed. A second spacer 475 may be provided on the vertical sidewalls of the word lines. The second spacer 475 may be a silicon nitride spacer. Each word line extends above the pattern surface 410 and along the pitch direction. The drawing on the right hand side of FIG. 9Q illustrates a cross-section of a word line along its longitudinal axis that runs perpendicular to the longitudinal axis of the semiconductor lamella 420. The drawing on the left hand side shows a cross-section along the pitch axis of the word lines, which corresponds to the longitudinal axis of the semiconductor lamella 420. The conductive layer 473 bears on the upper edges of those protrusions 451d that are assigned to the same word line. Between two neighboring protrusions 451d being assigned to the same word line, the word line bears on a section of the base layer 472.

A drain region 462 may be provided through a straight implant being effective on that portion of the semiconductor lamella 420 that faces the source region 461 at the buried gate electrode 465. The drain region 462 is shallow compared to the source region 461.

The first spacer 471 spaces the drain implantation from the gate electrode 465 to reduce a gate induced leakage current. A lower edge of the drain region 461 may be provided in the upper half of former groove 440, for example in the upper fifth or tenth part. The depth of the source region 461 may be the quintuple or decuple that of the drain region 462. A further portion of the semiconductor lamella 420 may remain p-conductive. Within the semiconductor lamella 420, a p-doped channel region 463 separates the source region 461 and the drain region 462. By applying a voltage higher than a threshold voltage to the gate electrode 465, an n-conductive channel 463a is formed adjacent to the gate dielectric 464 within the channel region 463 and connects the source region 461 and the drain region 462. The channel 463a comprises, for example, a first vertical section extending from the lower edge of source region 461 to the lower edge of gate electrode 465, a U-shaped section extending along the curved bottom portion of gate electrode 465, and a second vertical section extending between the U-shaped section and the lower edge of the drain region 462. The channel 463a of the field-effect transistor 496 is J-shaped in a cross-section parallel to the longitudinal axis of semiconductor lamella 420. The source region 461, the drain region 462, and the channel region 463 form the active area of the field-effect transistor 496.

A first section of the gate dielectric 464 separates the channel region 463 from the gate electrode 465. A second section of the gate dielectric 464 separates the drain region 462 from the gate electrode 465 and forms a second insulator structure 447. The second insulator structure 447 may consist of or comprise a Bird's Beak structure extending between the gate dielectric 464 and the protective liner 430. The Bird's Beak structure may result from an oxidation step described above with reference to FIG. 9N. The Bird's Beak structure may reduce a capacitive coupling between the drain section 462 and the gate electrode 465 and may further reduce a gate induced leakage current. The second insulator structure 447 may be thinner and less deep than the first insulator structure 446.

In an exemplary embodiment, the second insulator structure 447 and the gate dielectric 464 have a thickness of about 4 to 6 nanometers, whereas first insulator structure 446 has a thickness of about 6 to 50 nanometers. The reduced thickness of the second insulator structure 447 facilitates a wider cross-section of the gate electrode 465 resulting in a reduced resistance and, alternatively or in combination, opens up the possibility of a further shrink of the planar transistor dimensions. Due to the spacer layer 433, the upper edge of the gate electrode 465 may protrude above the pattern surface such that the conductive layer 473 of the word lines may bear directly on the gate electrode 465. Compared to symmetric transistor devices having the same planar and vertical dimensions, the J-shaped channel 463a may be longer such that the blocking and insulating properties of the field-effect transistor are improved. Compared to usual methods of forming EUDs, the method adds scarcely process complexity and may even be more simple in some respect. The transistor properties may be well controlled. A deposition interface between two gate electrode layers may be omitted.

Referring to FIG. 9R, the spaces between the word lines may be filled with an interlayer dielectric 491. The interlayer dielectric 491 is patterned by a photolithographic process, where contact openings may be formed in the interlayer dielectric 491 above the drain regions 462. The contact openings are filled with a conductive material to form contact structures 481 within the contact openings. FIG. 9R shows a contact structure 481 adjoining drain region 462.

Figure 10A:
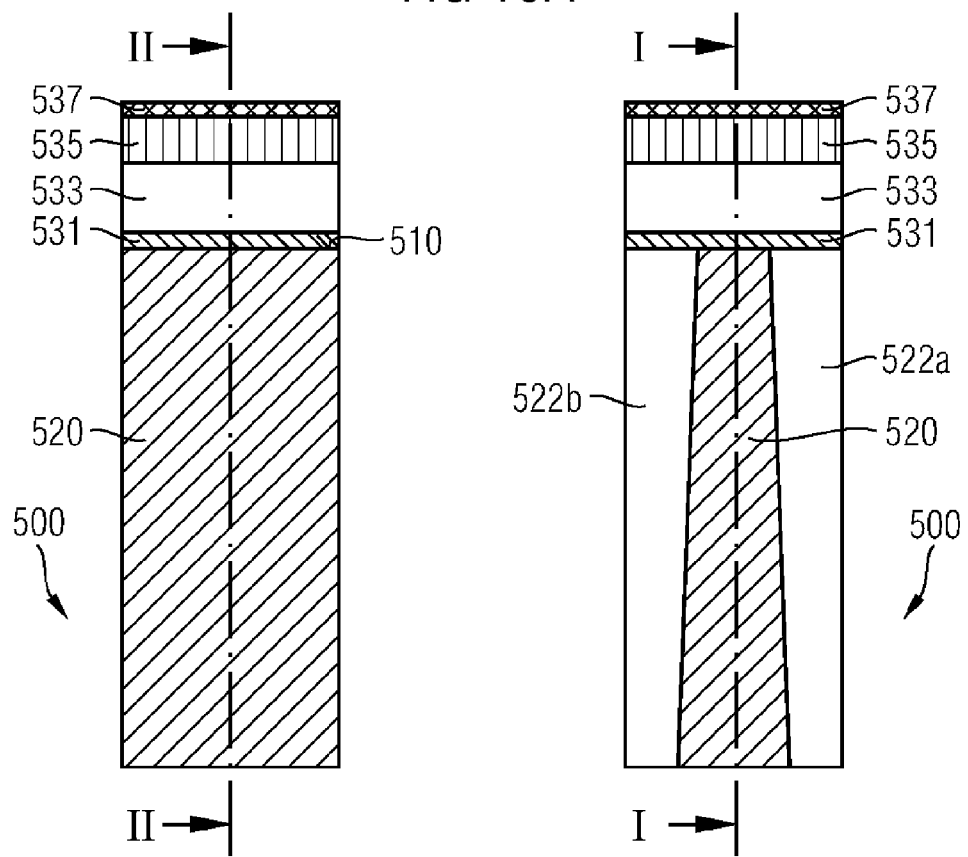
FIGS. 10A-10Q illustrate an exemplary method of fabricating a FinFET-like transistor with an asymmetric insulating structure, in which a sequence of cross-sectional views is depicted of a portion of a semiconductor substrate in different stages of manufacturing.
Figure 10B:
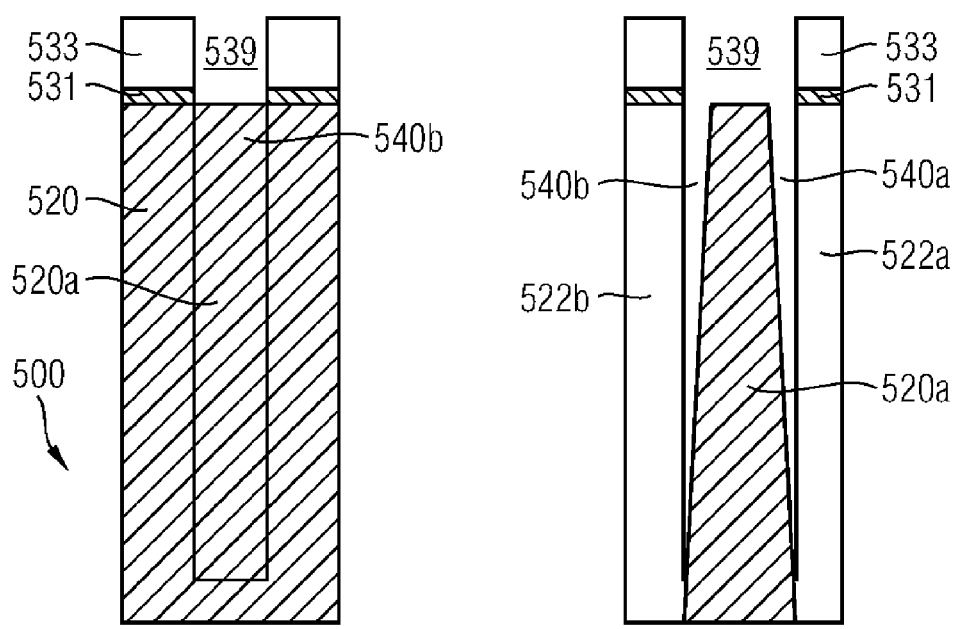
Figure 10C:
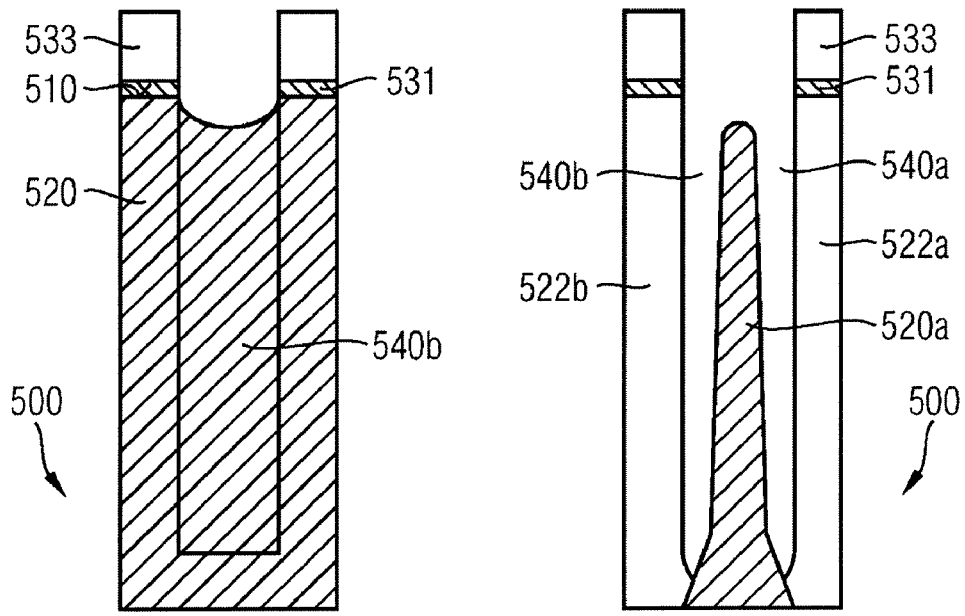
Figure 10D:
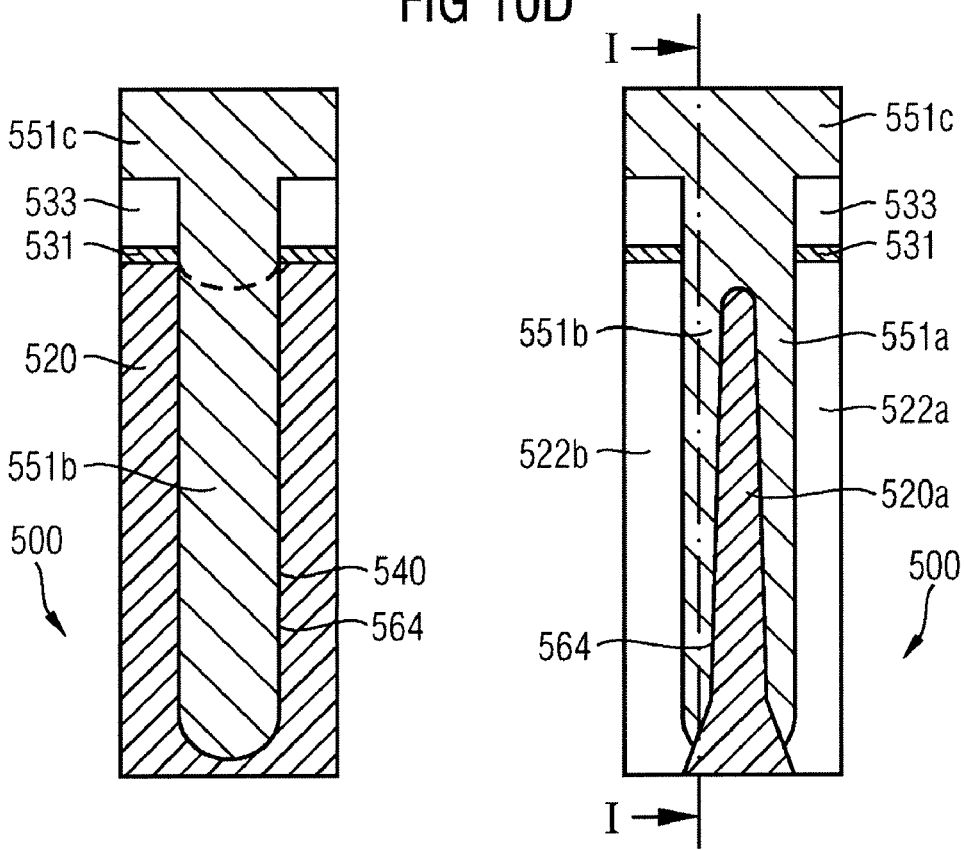
Figure 10E:
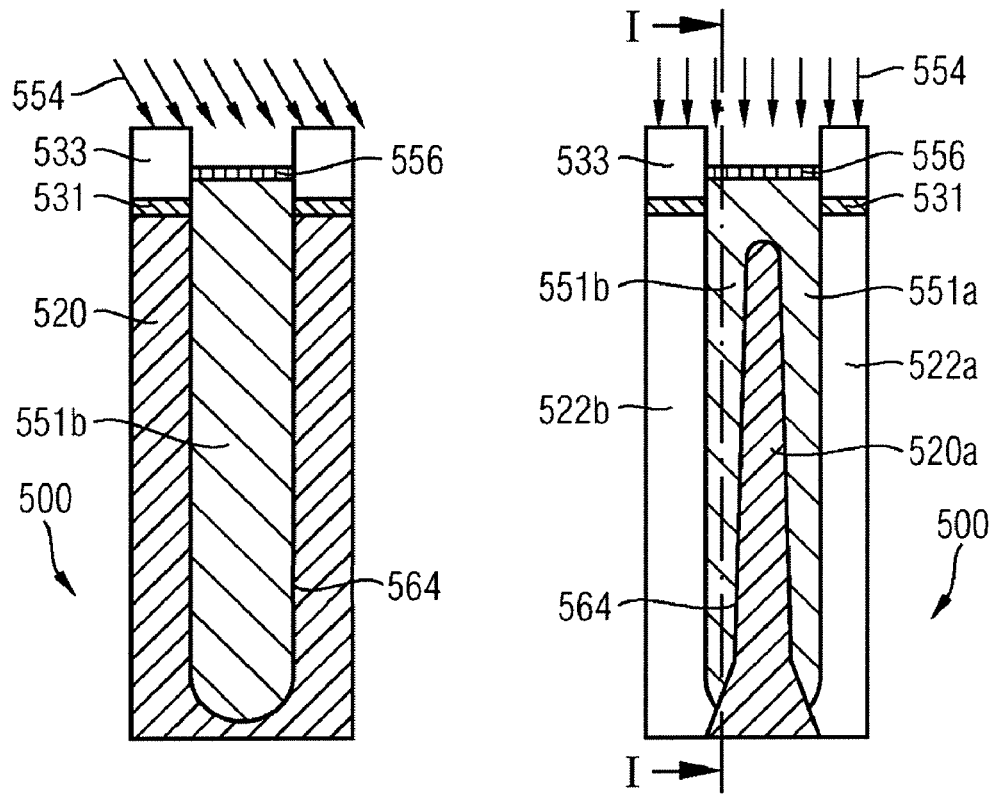
Figure 10F:
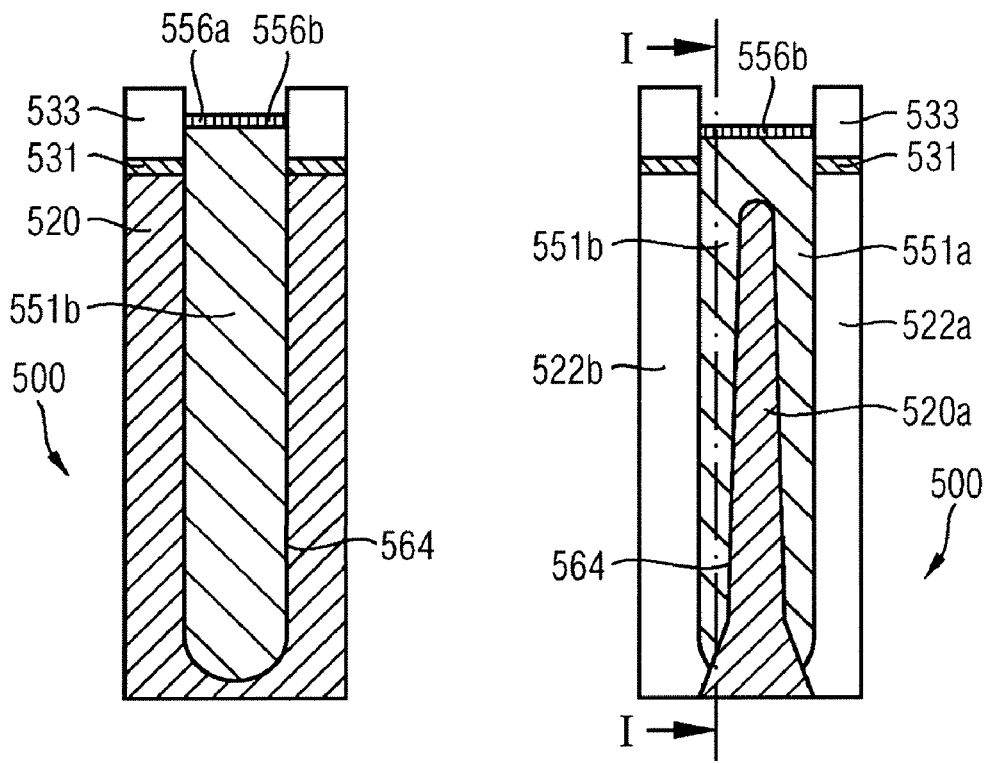
Figure 10K:
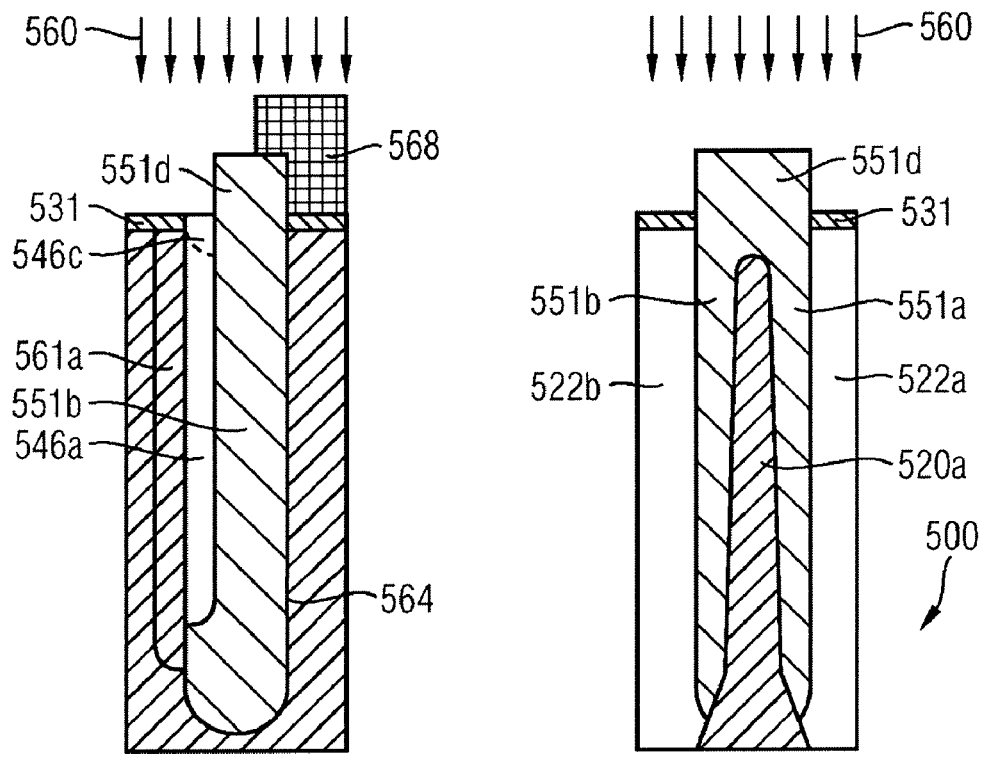
Figure 10L:
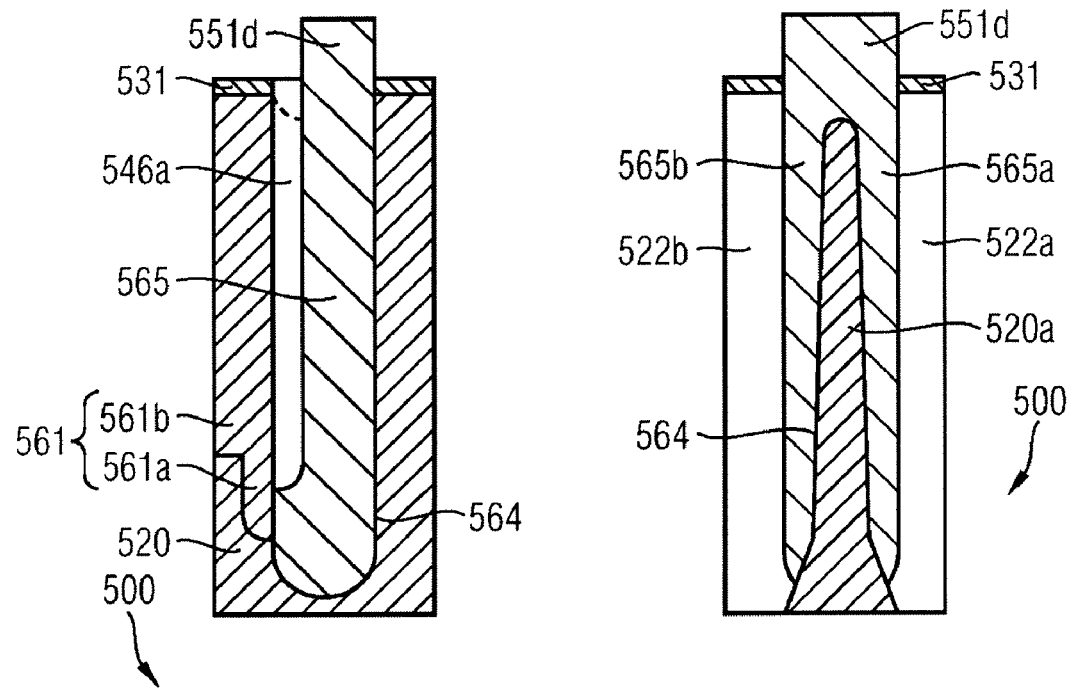
Figure 10P:
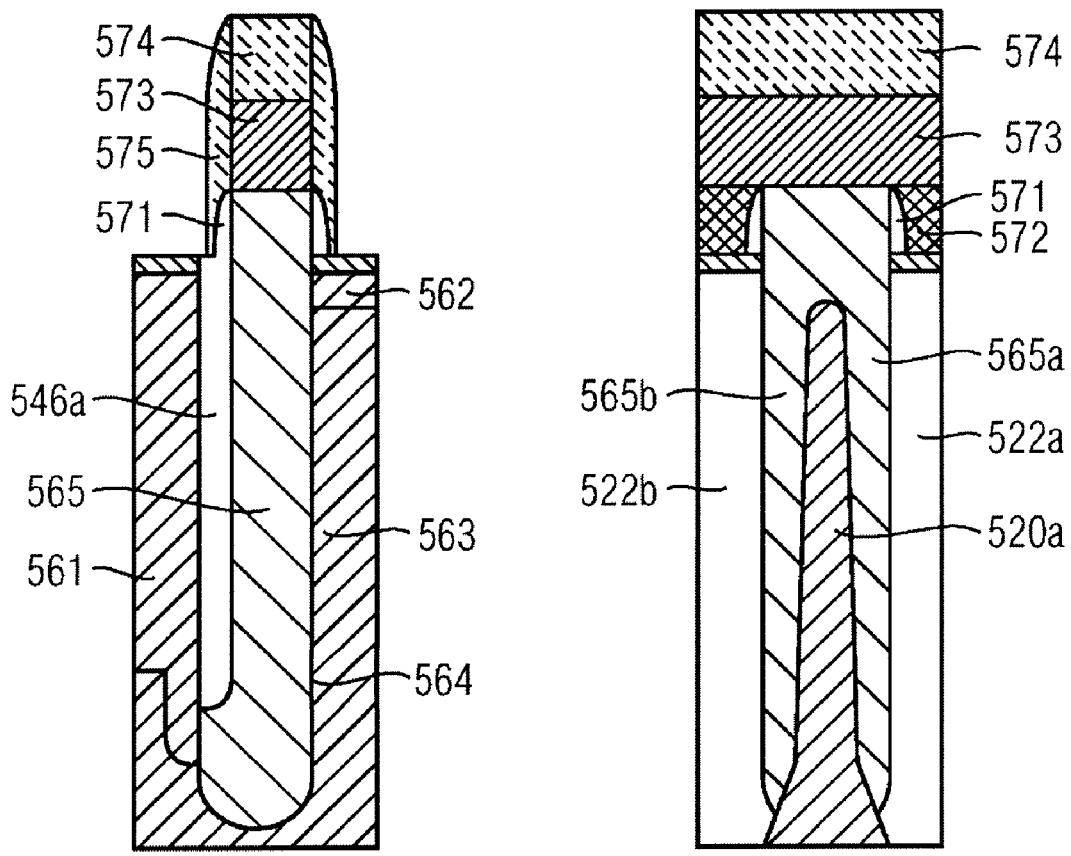
Figure 10Q:
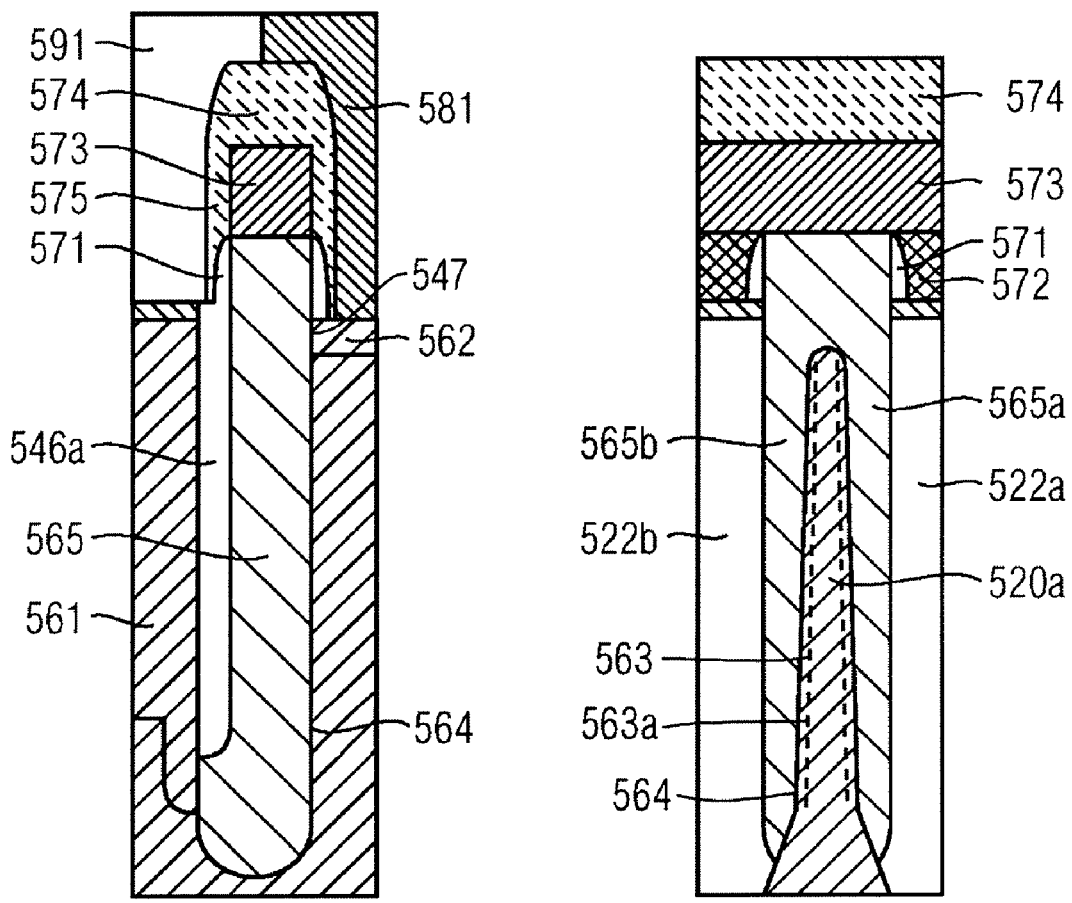

A method of forming a FinFET-like field-effect transistor is described herein with reference to FIGS. 10A-10Q. In particular, the following method focuses on the differences in comparison with the corresponding method as described above and depicted in FIGS. 9A-9R.

Referring to FIG. 10A, a semiconductor substrate 500 is depicted that may be lightly p-doped in an upper section adjoining a pattern surface 510 is provided. Two parallel insulator line structures 522a, 522b, for example silicon oxide structures, that adjoin the pattern surface 510 are formed within substrate 500. The two parallel neighboring insulator line structures 522a, 522b border an interposing adjacent semiconductor lamella 520 that may have a width corresponding to a minimum lithographic feature size for periodical line structures. The semiconductor lamella 520 extends along a longitudinal direction parallel to the cross section I-I. In an exemplary embodiment, the width of lamella 520 is about 40 nanometers or less.

An oxide layer (not shown) that may comprise or consist of silicon oxide, may be formed through thermal oxidation or deposition at least on those sections of the pattern surface 510 that are assigned to the semiconductor lamella 520. The oxide layer may have a thickness of 4 to 6 nanometers. An etch stop liner 531 is deposited on the pattern substrate 510 or the oxide layer. The etch stop liner 531 may comprise or consist of silicon nitride and may have a thickness of a few nanometers. A spacer layer 533 may be deposited on the etch stop liner 531. The material of the spacer layer 533 may be selectively removed against semiconductor substrate 500 and etch stop liner 531. The spacer layer 533 may be a silicon oxide layer that is deposited through a low pressure chemical vapor deposition (LPCVD) process and may have a thickness of about 50 to 400 nanometers. A mask layer 535 for patterning the spacer layer 533 is deposited on the spacer layer 533.

The material of the mask layer 535 is selected such that the material of the spacer layer 533 is selectively removed against it and such that the mask layer 535 may be removed during patterning a semiconductor portion of the substrate 500. The mask layer 535 may be a polycrystalline silicon layer. A resist layer 537 may be provided on the mask layer 535.

Referring to FIG. 10B, the resist layer 537 may be patterned by photolithographic techniques. By developing the resist layer 537 after exposure, an opening is formed first in the resist layer 537, then transferred into the mask layer 535 and then transferred into the spacer layer 533. The cross section of a resulting opening 539 in the spacer layer 533 may be a circle or an ellipse with different dimensions along the cross sectional lines. The etch stop liner 531 is etched through. Using an anisotropic etch, which may be a reactive ion beam etch process, the opening 539 is transferred into the exposed sections of the insulator line structures 522a, 522b.

As shown in FIG. 10B, in each insulator line structure 522a, 522b a groove 540a, 540b is formed. The two grooves 540a, 540b face each other at an interposing adjacent semiconductor fin 520a that is part of the semiconductor lamella 520. The patterned resist layer 537 and residues of the mask layer 535 are removed from the surface of the spacer layer 533. The cross section of the grooves 540a, 540b results from the overlap of the opening 539 and the respective insulator line structure 520a, 520b. The depth of the grooves 540a, 540b may be larger than the width of the lamella, for example at least a quintuple of the width of the lamella. According to an exemplary embodiment, the depth of the grooves 540a, 540b is at least 100 nanometer and the grooves 540a, 540b are substantially symmetric to the middle of lamella 520.

With reference to FIG. 10C, the exposed portion of the lamella 520, including fin 520a, may be recessed by an isotropic etch that is effective on the semiconductor material of the fin 520a. The etch process may be a reactive ion beam etch process. FIG. 10C shows the recessed fin 520a, which is thinned along a pitch axis of the semiconductor lamella 520 that is perpendicular to the longitudinal axis.

Referring to FIG. 10D, a gate dielectric 564 may be provided on exposed sections of the semiconductor lamella 520 and the fin 520a. Gate dielectric 564 may be formed through thermal oxidation of the semiconductor material of lamella 520 or through deposition of a conformal dielectric liner. A fill material 551 is deposited, for example via a chemical vapor deposition process.

FIG. 10D shows the gate dielectric 564 that covers the semiconductor lamella 520 in sections that correspond to those sections of the lamella 520 that are exposed by the grooves 540a, 540b in FIG. 10B and that include the exposed surface of the semiconductor fin 520a. A fill portion 551b of the fill material 551 fills a main portion of the grooves 540a,

540b. An overfill portion 551c covers the spacer layer 533. The fill material 551 may be a conductive material, for example heavily doped polysilicon. The cross-section I-I in this and the following FIGS. 10E-10G is taken along the fill portion 551b respectively.

Referring to FIG. 10E, the fill material 551 may be recessed, where the overfill portion 551c may be removed and an upper edge of fill portion 551a may be drawn back from the upper edge of spacer layer 533. The recess is controlled such that the distance between the upper edges of spacer layer 533 and the residual fill portion 551a corresponds to a predetermined distance. A top mask liner 556 may be provided on top of the fill portion 551a. The material of the top mask liner 556 is selected such that the etch resistance of a doped portion is different from that of an undoped portion. The top mask liner 556 may be a silicon oxide or silicon nitride liner that is grown thermally on the exposed surface of the fill portion 551a and that may have a thickness of less than 6 nanometers.

FIG. 10E shows top mask liner 556 that covers an upper edge of the recessed fill portion 551a. The top mask liner 556 is exposed to an implantation beam 554 with an implantation axis that is oblique to a pitch plane extending along the pitch axis and perpendicular to the pattern surface 510. Further according to FIG. 10E, a portion of the top mask liner 556 in a blind area of the ion beam is shielded against the implant.

As illustrated in detail in FIG. 10F, a first section 556a of the top mask liner 556 that is shielded by the upper edge of spacer layer 533 remains undoped. A second section 556b of top mask liner 556 that is exposed to the ion beam is doped. The top mask liner 556 may be a thin silicon nitride liner. The length of the first section 556a is adjustable by the predetermined distance and the inclination of the implantation axis. According to another embodiment, the second section 556b of the top mask liner 556 is formed through implantation of the upper edge of the fill portion 551a, where the first section 556a of the top mask liner 556 corresponds to a non-implanted section of the upper surface of the fill portion 551a.

Referring to FIG. 10G, the first section 556a may be removed selectively against the second section 556b. The second section 556b may provided as a top mask that acts as an etch mask in a following anisotropic etch process that is effective on the recessed fill portion 551a of the fill material 551. The anisotropic etch process may be a reactive ion beam etch process.

According to another embodiment the second section 556b may be removed selectively against the first section 556a. A silicon oxide mask may then be grown thermally on the exposed portion of the fill material 551. The first section 556a of the original top mask is removed selectively against the silicon oxide mask that provides a new top mask acting as an etch mask in the following. Other methods as described for example with reference to the previous embodiment depicted in FIGS. 9A-9R may alternatively be provided to form the top mask.

As shown in FIG. 10G, a U-shaped gap 544 may then be formed beneath former first section 556a through etching an exposed second portion of the fill material 551. Two leg sections of the U-shaped gap 544 extend within the former grooves 540a, 540b respectively. A saddle section of the gap 544 bears on an exposed portion of the fin 520a. The gap 544 separates a gate electrode 565 formed by the recessed fill material 551 and a portion of the semiconductor lamella 520 and extends along a portion of the sidewalls of the grooves 540a, 540b. The second portion 556b of the top mask liner 556 shields a first portion of the fill material 551.

As can be seen in FIG. 10H, a first section 561a of a source region 561 of the field-effect transistor may be formed in sections of lamella 520, including fin 520a, that are accessible via gap 544. The first section 561a may be formed by out-diffusion from the gaseous phase. A lower edge of the first section 561a is adjusted by the lower edge of gap 544. The first section 561a may be a low doped section of the source region 561.

Referring to FIG. 10I, the U-shaped gap 544 may be covered or filled with an insulator material 545 that may be a silicon oxide deposited by a process with sufficient covering or gap fill properties, for example a spin-on-glass deposition or ALD, or a thermal silicon oxide. The recessed fill portion 551a forms a U-shaped gate electrode 565 of the field-effect transistor. The gate electrode 565 extends along sections of the two long sides of the fin 520a and along the upper edge of the fin 520a.

As can be seen from the process steps illustrated in FIGS. 10J-10Q, the method of forming the FinFET-like field-effect transistor may correspond substantially to that of forming the EUD with J-shaped channel as illustrated in FIGS. 9K-9R.

As shown in FIG. 10J, the insulator material 545 is recessed and forms an U-shaped insulator structure 546 that bears in its saddle section 546c on the upper edge of fin 520a. The leg portions 546a of the insulator structure 546 separate the gate electrode 565 from a section of the low doped first section 561a within the semiconductor lamella 520 and semiconductor fin 520a. A top portion 551d of the gate electrode 565 projects above pattern surface 510.

Referring to FIG. 10K, an implant mask 568 may be formed above the pattern surface 510 to form a heavily doped portion 561b of the source region 561 through a straight implant 568, where, by way of example, the lower edge of the heavily doped section 561b does not fall below the lower edge of the insulator structure 546. The second section 561b overlaps in sections the first section 561a, where the insulator structure 546 separates the heavily doped section 561b completely from the gate electrode 565. A potential reduction zone, within which a potential applied to an upper edge of the source region 561 is reduced toward the lower edge, is capacitively decoupled from the gate electrode 565. Additionally, the lower edge of the source region 561 is substantially self-aligned to the lower edge of the insulator structure 546.

A thermal oxidation process may be performed in order to support the formation of Bird's Beak structures at the junctions of the gate dielectric 564 to an oxide layer (not shown) covering the top surface of the lamella. The Bird's Beak structure is a wedge-shaped junction between the narrow gate dielectric and the oxide layer. The oxide liner covering the pattern surface 510 in a section assigned to the lamella 520 may result from or be enforced through the thermal oxidation process.

Referring to FIGS. 10M-10Q, the formation of a first spacer 571 encapsulating the protrusions 551d of the gate electrode 565, a base layer 572 filling the space between the protrusions 551d, word lines comprising in each case a portion of a base layer 572, a conductive layer 573, and a dielectric cap layer 574, a second spacer 575 on the vertical sidewalls of the word lines, a drain region 562 facing the source region 561 at the fin 520a, an interlayer dielectric 591 filling the spaces between the word lines, and contact structures 581 for accessing the drain regions 562 essentially correspond to the process steps for the previous embodiment described above and depicted in FIGS. 9N-9R.

As shown in FIG. 10Q, a p-doped channel region 563 that is formed within the fin 520a separates the source region 561 and the drain region 562. By applying a voltage higher than a threshold voltage to the gate electrode 565, an n-conductive channel 563a is formed within the channel region 563 adjacent to the gate dielectric 564 and connects the source region 561 and the drain region 562. The channel 563a extends along the long sides of the fin 520a between the source region 561 and the drain region 562.

A first section of the gate dielectric 564 separates the channel region 563 and the gate electrode 565. A second section of the gate dielectric 564 separates the drain region 562 and the gate electrode 565 and forms a second insulator structure 547. The second insulator structure 547 is thinner than the first insulator structure 546. In an exemplary embodiment, the second insulator structure 547 and the gate dielectric 564 have a thickness of about 4 to 6 nanometers, whereas the first insulator structure 546 has a thickness of about 6 to 50 nanometers. The second insulator structure 547 may consist of or comprise a Bird's Beak structure as described with reference to FIG. 10K. The reduced thickness of the second insulator structure 547 may provide a wider cross-section of the gate electrode 565 and a reduced resistance and, alternatively or in combination, opens up the possibility to a further shrink of the planar transistor dimensions.

Figure 11A:
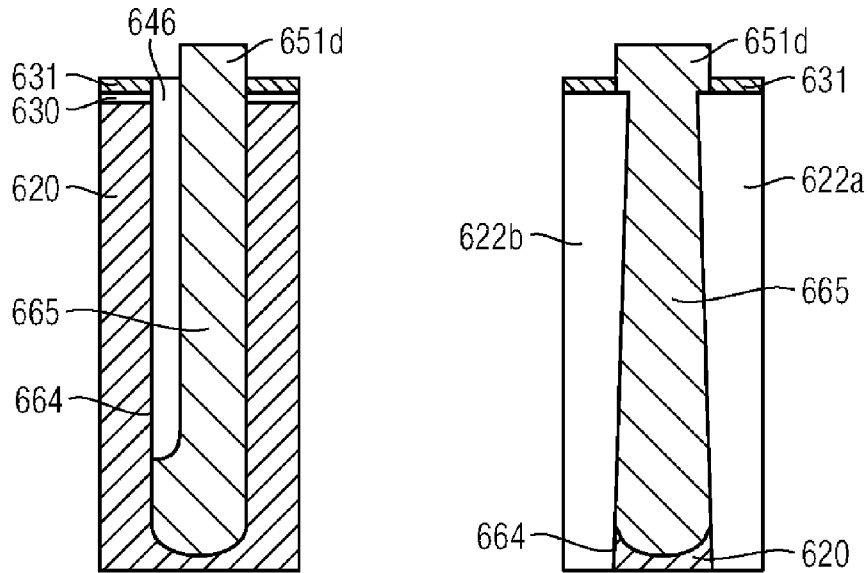
FIGS. 11A-11B illustrate an exemplary method of fabricating a field-effect transistor, for example for high voltage applications, with at least one vertical channel section and an asymmetric insulating structure, in which a sequence of cross-sectional views is depicted of a portion of a semiconductor substrate in different stages of manufacturing.
Figure 11B:
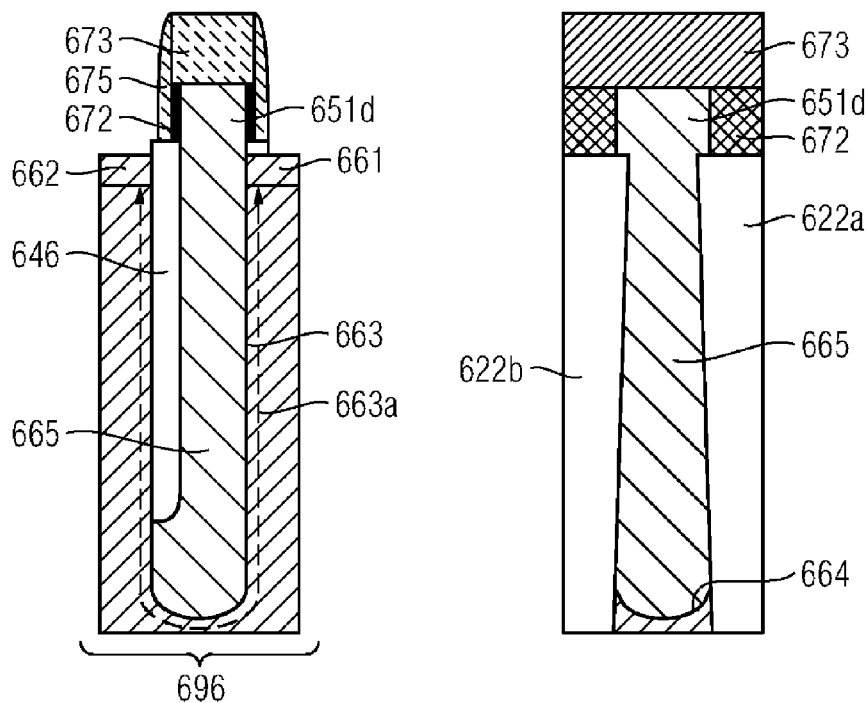

The embodiment of FIGS. 11A and 11B depict a method of forming a field-effect transistor with asymmetric insulator structures for high voltage applications. The formation of the field-effect transistor may basically follow the process as described above with reference to FIGS. 9A-9K.

The embodiment depicted in FIG. 11A basically corresponds with the embodiment depicted in FIG. 9K, with the exception that the additional isotropic etch which is carried out on a material of the insulator line structures 622a, 622b as shown in FIG. 9D may be omitted. Accordingly, FIG. 11A shows a section of a semiconductor lamella 620 extending along a longitudinal direction. The semiconductor lamella 620 may be p-doped single crystalline silicon. A protective liner 630 may cover the semiconductor lamella 620. In an exemplary embodiment, the protective liner 630 is a silicon oxide liner. In a pitch direction that is perpendicular to the longitudinal direction the semiconductor lamella 620 confines to two opposing insulator line structures 622a, 622b. An etch stop liner 631 may cover a pattern surface that is formed in sections by the insulator line structures 622a, 622b and the protective liner 630. A gate electrode 665 is disposed with a lower portion below the upper edge of semiconductor lamella 620 and with a protrusion portion 651d protruding above the pattern surface. The depth of the insulator line structures 622a, 622b may exceed the depth of the gate electrode 665. An asymmetric insulator structure 646 is provided between the semiconductor lamella 620 and a section of the lower portion of the gate electrode 665. A gate dielectric 664 separates the gate electrode 665 from the semiconductor lamella 620. The first insulator structure 646 may be provided via one of the methods as described in detail with reference to FIG. 9J.

Referring to FIG. 11B, the field-effect transistor 696 is formed according to the process steps as described in detail above and with reference to FIGS. 9O-9R, with the exception that one common implant may provide the source 661 and the drain 662 region. Further, the formation of a first spacer may be omitted such that the vertical sidewalls of the protrusion portions 651d confine directly to the base layer of a connection line 672.

FIG. 11B shows a field-effect transistor 696 with a source 661 and drain 662 region formed in the upper portions of the semiconductor lamella 620. The lower edges of the source/drain region 661, 662 are provided above a lower edge of the first insulator structure 646. The source region 661 and the drain region 662 face each other at the gate electrode 665. The lower edge of gate electrode 665 is provided below the lower edge of the first insulator structure 646. The gate dielectric 664 may separate the gate electrode 665 and the source region 661 and also a first section of a channel region 663 adjoining the source region 661. The insulator structure 646 may separate the gate electrode 665 and the drain region 662 and a second section of the channel region 663 adjoining the drain region 662. The second section of the channel region may act as a drift zone. The insulator structure 646 is significantly thicker than the gate dielectric 664 and decouples the gate electrode 665 from a high potential applied to the drain region 662.

A connection line includes a base layer 672 and a high conductivity layer 673. According to this exemplary embodiment, the connection line extends along the pitch direction. The high conductivity layer 673 bears in sections on the upper edge of the protrusion portions 651d of the gate electrode 665 and on sections of the base layer 672 between the protrusion portions 651d. According to a further example, a plurality of such field-effect transistors is arranged in parallel.

Figure 12:
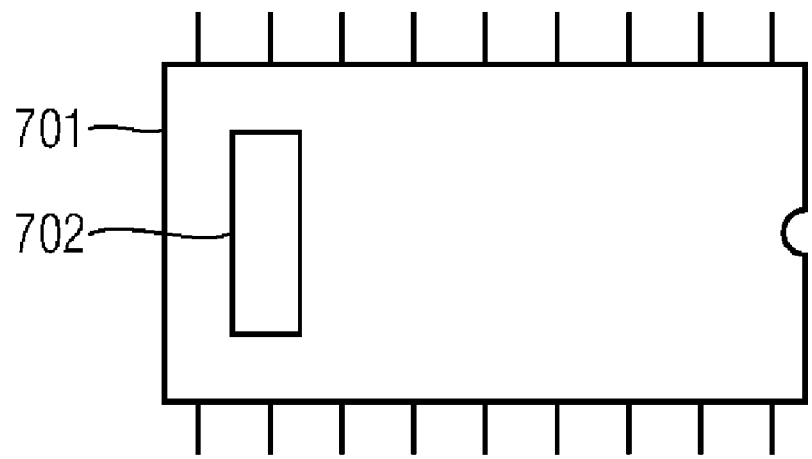
FIG. 12 is a schematic illustration of an exemplary embodiment of an integrated circuit.

FIG. 12 is a schematic illustration of an integrated circuit 701. The integrated circuit 701 comprises a field-effect transistor 702 as described above. The integrated circuit may be a DRAM, for example a graphics DRAM, a consumer DRAM or a cellular DRAM, a SoC comprising DRAMs or any other type of memory device, for example such of one-transistor-type MRAMs, PCRAMs or FeRAMs or integrated circuits for power applications, for example Power-MOSFETs, IGBTs and smart power products comprising Power-MOSFETs or IGBTs.

Figure 13:
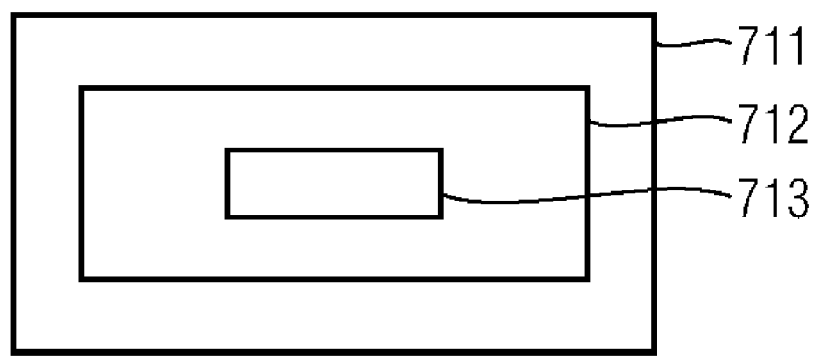
FIG. 13 is a schematic illustration of an exemplary embodiment of an electronic system.

FIG. 13 is a schematic illustration of an electronic system 711. The electronic system comprises an electronic device 712. The electronic device 712 may include at least one field effect transistor 713 as described above. The electronic system 711 may be, for example, an audio system, a video system, a graphic card of a computer system, a computer system, as for example a server, a communication system, for example a cellular phone, an imaging system, for example a digital camera, a data storage system, for example a date storage module for computer systems, a portable data storage device or a digital processing system such as a processor. According to other embodiments, the electronic system may be a voltage supply unit, a regulator unit or an electric system for automotive applications.

While the above embodiments have been described in detail and with reference to the figures, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit comprising:
   a field-effect transistor comprising:
   a source region, a drain region, and a channel region;
   a gate electrode having a lower edge below a lower edge of at least one of the source and drain regions;
   a gate dielectric arranged between the channel region and the gate electrode;
   a first insulator structure arranged between the gate electrode and at least a section of the source region, the first insulator structure not being present between the gate electrode and the drain region; and
   a second insulator structure arranged between the gate electrode and only at a section of the drain region, the second insulator structure not being present between the gate electrode and the source region, wherein at least one of the first and second insulator structures is structurally different from the gate dielectric and the first and the second insulator structures are asymmetric to each other with respect to a plane perpendicular to a line connecting the source and drain regions, and wherein the first insulator structure extends to a first depth within a semiconductor substrate and the second insulator structure extends to a second depth within the semiconductor substrate, the second depth differing from the first depth by at least 10 percent.

2. The integrated circuit of claim 1, wherein at least one geometric dimension of the first insulator structure differs from at least one geometric dimension of the second insulator structure by at least 10 percent.

3. The integrated circuit of claim 2, wherein the first insulator structure comprises a section having a first thickness and the second insulator structure has a second thickness differing from the first thickness by at least 10 percent.

4. The integrated circuit of claim 3, wherein the second thickness differs from the first thickness by at least 50 percent.

5. The integrated circuit of claim 4, wherein the gate dielectric has a thickness equal to one of the first thickness and the second thickness.

6. The integrated circuit of claim 4, wherein at least a portion of one of the first and second insulator structures comprises a Bird's Beak structure that forms a wedge-shaped junction with a pattern surface of a semiconductor substrate in which the field-effect transistor is formed.

7. The integrated circuit of claim 1, wherein the second depth differs from the first depth by at least 50 percent.

8. The integrated circuit of claim 1, wherein the gate electrode is arranged in a groove formed in a semiconductor substrate and extends between a pattern surface and a device depth of the semiconductor substrate, and the semiconductor substrate comprises the source, drain and channel regions.

9. The integrated circuit of claim 8, wherein the drain region extends between the pattern surface and a lower drain region edge that is formed at or above the device depth.

10. The integrated circuit of claim 8, wherein the source region extends between the pattern surface and a lower source region edge at or above the device depth.

11. The integrated circuit of claim 1, wherein a portion of the channel region is formed below the gate electrode.

12. The integrated circuit of claim 1, wherein the source, drain and channel regions are formed within a semiconductor lamella extending along a longitudinal direction of a semiconductor substrate, the semiconductor lamella comprising vertical longitudinal sidewalls, the semiconductor lamella is confined in a pitch direction that extends perpendicular to the longitudinal direction by two insulator line structures, the two insulator line structures facing each other at the semiconductor lamella, and the semiconductor lamella has a lamella depth that exceeds the device depth.

13. The integrated circuit of claim 12, wherein:
the gate electrode comprises a main section and two corner sections;
the main section extends with substantially the same profile between the insulator line structures so as to form, with the semiconductor lamella, a device edge at each interface with the insulator line structures; and
each corner section is disposed between the semiconductor lamella and one of the insulator line structures and extends along one of the device edges, wherein electrical fields of the main section and the corner section superpose at two edge sections of the channel region extending along the device edges.

14. The integrated circuit of claim 13, wherein the device edge is U-shaped.

15. The integrated circuit of claim 13, wherein each corner section covers a sidewall of the semiconductor lamella in a uniform corner width along the corresponding device edge.

16. The integrated circuit of claim 12, wherein:
the gate electrode is arranged in a groove formed in a semiconductor substrate that comprises the source, drain and channel regions, the groove extends between a pattern surface of the semiconductor substrate and a device depth, and the groove further forms longitudinal sidewalls in a longitudinal direction with the insulator line structures and transverse sidewalls with the semiconductor lamella;
the semiconductor lamella comprises a semiconductor fin that is thinner than the semiconductor lamella, the semiconductor lamella extends in the longitudinal direction through the groove and, in a vertical direction, between an upper fin edge and a bottom of the groove; and
the channel region is formed at least partly within the semiconductor fin.

17. The integrated circuit of claim 16, wherein the gate electrode comprises two subsections facing each other at the semiconductor fin.

18. The integrated circuit of claim 16, wherein the upper fin edge is formed below the pattern surface.

19. The integrated circuit of claim 16, wherein the upper fin edge is formed below at least one of the lower edges of the insulator structures.

20. The integrated circuit of claim 16, wherein the semiconductor fin extends from one transverse sidewall to the other.

21. The integrated circuit of claim 20, wherein one of the first and second insulator structures is U-shaped and comprises two vertical insulator subsections, each vertical insulator subsection extending between the gate electrode and the semiconductor lamella, and a horizontal insulator subsection bearing on the semiconductor fin and connecting the vertical subsections.

22. The integrated circuit of claim 16, wherein at least an upper section of the semiconductor fin has a fin width that enables a fully depleted operation mode.

23. The integrated circuit of claim 22, wherein the fin width is less than 40 nanometers.

24. The integrated circuit of claim 16, wherein the semiconductor fin is arranged adjacent one of the transverse sidewalls and is separated from the other transverse sidewall via a fin gap.

25. The integrated circuit of claim 24, wherein one of the first and second insulator structures fills at least an upper portion of the fin gap.

26. The integrated circuit of claim 12, wherein the gate electrode extends with substantially the same profile between the insulator line structures.

27. The integrated circuit of claim 1, further comprising:
a storage capacitor coupled to the field-effect transistor such that the field-effect transistor and the storage capacitor are operable as a memory cell.

28. An electronic system comprising the integrated circuit of claim 1.

29. The integrated circuit of claim 1, wherein the gate electrode is arranged between the source region and the drain region.

30. The integrated circuit of claim 1, wherein at least one of the first and second insulator structures has a different thicknesses than the gate dielectric.

31. The integrated circuit of claim 1, wherein at least one of the first and second insulator structures extends into a semiconductor substrate to a different depth than the gate dielectric.

32. An integrated circuit comprising:
a field-effect transistor comprising:
a source region, a drain region, and a channel region;
a gate electrode having a lower edge below a lower edge of at least one of the source and drain regions;
a gate dielectric arranged between the channel region and the gate electrode;
a first insulator structure arranged between the gate electrode and at least a section of the source region, the first insulator structure not being present between the gate electrode and the drain region; and
a second insulator structure arranged between the gate electrode and at least a section of the drain region, the second insulator structure not being present between the gate electrode and the source region,
wherein at least one of the first and second insulator structures is structurally different from the date dielectric and the first and the second insulator structures are asymmetric to each other with respect to a plane being perpendicular to a line connecting the source and the drain regions,
wherein the gate electrode is arranged in a groove formed in a semiconductor substrate and extends between a pattern surface and a device depth of the semiconductor substrate, and the semiconductor substrate comprises the source, drain and channel regions,
wherein the drain region extends between the pattern surface and a lower drain region edge that is formed at or above the device depth, and
wherein the lower drain region edge is aligned with a lower edge of the second insulator structure.

33. An integrated circuit comprising:
a field-effect transistor comprising:
a source region, a drain region, and a channel region;
a gate electrode having a lower edge below a lower edge of at least one of the source and drain regions;
a gate dielectric arranged between the channel region and the gate electrode;
a first insulator structure arranged between the gate electrode and at least a section of the source region, the first insulator structure not being present between the gate electrode and the drain region; and
a second insulator structure arranged between the gate electrode and at least a section of the drain region, the second insulator structure not being present between the gate electrode and the source region,
wherein at least one of the first and second insulator structures is structurally different from the date dielectric and the first and the second insulator structures are asymmetric to each other with respect to a plane being perpendicular to a line connecting the source and the drain regions,
wherein the gate electrode is arranged in a groove formed in a semiconductor substrate and extends between a pattern surface and a device depth of the semiconductor substrate, and the semiconductor substrate comprises the source, drain and channel regions,
wherein the source region extends between the pattern surface and a lower source region edge at or above the device depth, and wherein at least one of the source and drain regions comprises a heavily doped section adjacent the pattern surface and a low doped section extending between the heavily doped section and the channel region, wherein a lower edge of the low doped section is formed at or above the device depth and a lower edge of the heavily doped section is formed above the lower edge of the corresponding first or second insulator structure;
wherein at least one of the first and second insulators comprises a different material than the gate dielectric.

34. An integrated circuit comprising:
a field-effect transistor comprising:
a source region, a drain region, and a channel region;
a gate electrode having a lower edge below a lower edge of at least one of the source and drain regions;
a gate dielectric arranged between the channel region and the gate electrode;
a first insulator structure arranged between the gate electrode and at least a section of the source region, the first insulator structure not being present between the gate electrode and the drain region; and
a second insulator structure arranged between the gate electrode and at least a section of the drain region, the second insulator structure not being present between the gate electrode and the source region,
wherein at least one of the first and second insulator structures is structurally different from the gate dielectric and the first and the second insulator structures are asymmetric to each other with respect to a plane being perpendicular to a line connecting the source and the drain regions, and
wherein at least one of the first and second insulators comprises a different material than the gate dielectric.

35. An integrated circuit comprising a field-effect transistor comprising:
a source region, a drain region, and a channel region;
a gate electrode having a lower edge below a lower edge of at least one of the source and drain regions;
a gate dielectric arranged between the channel region and the gate electrode;
a first insulator structure arranged between the gate electrode and at least a section of the source region, the first insulator structure not being present between the gate electrode and the drain region; and
a second insulator structure arranged between the gate electrode and at least a section of the drain region, the second insulator structure not being present between the gate electrode and the source region, wherein at least one of the first and second insulator structures is structurally different from the gate dielectric and the second insulator structure is thinner than the first insulator structure, wherein at least one of the first and second insulators comprises a different material than the gate dielectric.

36. The integrated circuit of claim 35, wherein at least one of the first and second insulator structures has a different thickness than the gate dielectric.

37. The integrated circuit of claim 35, wherein at least one of the first and second insulator structures extends into a semiconductor substrate to a different depth than the gate dielectric.

* * * * *